(12) United States Patent
Izuha et al.

(10) Patent No.: US 8,847,135 B2
(45) Date of Patent: Sep. 30, 2014

(54) SOLID-STATE IMAGING DEVICE, DRIVING METHOD THEREOF AND ELECTRONIC APPARATUS

(75) Inventors: Kyoko Izuha, Kanagawa (JP); Kouichi Harada, Kanagawa (JP)

(73) Assignee: Sony Corporation, Tokyo (JP)

( * ) Notice: Subject to any disclaimer, the term of this patent is extended or adjusted under 35 U.S.C. 154(b) by 460 days.

(21) Appl. No.: 13/185,170

(22) Filed: Jul. 18, 2011

(65) Prior Publication Data

US 2012/0025061 A1 Feb. 2, 2012

(30) Foreign Application Priority Data

Jul. 30, 2010 (JP) .................................. 2010-172755
Sep. 17, 2010 (JP) .................................. 2010-209113

(51) Int. Cl.
*H01L 27/00* (2006.01)
*H01L 27/146* (2006.01)

(52) U.S. Cl.
CPC ..... *H01L 27/14625* (2013.01); *H01L 27/14621* (2013.01); *H01L 27/14609* (2013.01); *H01L 27/14603* (2013.01)
USPC ...................................................... 250/208.1

(58) Field of Classification Search
CPC .... H01L 27/00; H01L 27/146; H01L 31/0232
USPC ............ 250/208.1, 214.1, 226; 252/582–583; 359/265–275
See application file for complete search history.

(56) References Cited

U.S. PATENT DOCUMENTS

| | | | |
|---|---|---|---|
| 6,388,709 B1 | 5/2002 | Kobayashi et al. | |
| 6,861,014 B2 * | 3/2005 | Fitzmaurice et al. | 252/583 |
| 6,867,894 B2 * | 3/2005 | Asano et al. | 359/272 |
| 2003/0103151 A1 * | 6/2003 | Luo | 348/273 |
| 2005/0046920 A1 * | 3/2005 | Freeman et al. | 359/265 |
| 2010/0108867 A1 | 5/2010 | Caubet et al. | |

FOREIGN PATENT DOCUMENTS

| | | |
|---|---|---|
| JP | 64-075602 | 3/1989 |
| JP | 08-294059 | 11/1996 |
| JP | 09-129859 | 5/1997 |
| JP | 2001-352490 | 12/2001 |
| JP | 2006-333439 | 12/2006 |
| JP | 2007-329721 | 12/2007 |
| JP | 2008-124941 | 5/2008 |
| JP | 2008-167004 | 7/2008 |

OTHER PUBLICATIONS

Toshinori Otaka et al.; 12-Bit Column-Parallel ADC with Accelerated Ramp; 2005 IEEE Workshop on Charge-Coupled Devices and Advanced Image Sensors; pp. 173.
M. F. Snoeij et al.; A Low-Power Column-Parallel 12-bit ADC for CMOS Imagers; 2005 IEEE Workshop on Charge-Coupled Devices and Advanced Image Sensors; pp. 169.
European Search Report issued on Nov. 30, 2011 in connection with counterpart EP application No. EP 11 00 6038.

\* cited by examiner

*Primary Examiner* — Seung C Sohn
(74) *Attorney, Agent, or Firm* — Dentons US LLP

(57) ABSTRACT

A solid-state imaging device includes: a semiconductor substrate including a light receiving surface which is divided according to pixels arranged in a matrix shape and is formed with a photoelectric converting section; an electrochromic film which is formed on the semiconductor substrate on a light incident path corresponding to the photoelectric converting section, in a portion of pixels selected from the pixels, and has light transmittance changing from a first transmittance to a second transmittance according to voltage applied thereto; a lower electrode which is formed below the electrochromic film; and an upper electrode which is formed above the electrochromic film.

7 Claims, 16 Drawing Sheets

SOLID-STATE IMAGING DEVICE, DRIVING METHOD THEREOF AND ELECTRONIC APPARATUS

FIELD

The present disclosure relates to a solid-state imaging device, a driving method thereof and an electronic apparatus, and in particular, to a solid-state imaging device which has color filters of R (Red), G (Green) and B (Blue), a driving method thereof and an electronic apparatus.

BACKGROUND

An electronic apparatus such as a digital video electronic device or a digital still electronic device includes a solid-state imaging device such as a CCD (Charge Coupled Device) image sensor or a CMOS (Complementary Metal-Oxide-Silicon Transistor) image sensor.

In the solid-state imaging device, a plurality of pixels is arranged on a semiconductor substrate in a matrix shape in horizontal and vertical directions. Further, a light receiving surface is formed on the semiconductor substrate. In the light receiving surface, for example, a sensor which is a photoelectric converting section such as a photodiode is installed for each pixel.

On the light receiving surface is formed a light concentrating structure which concentrates light by a subject image into the sensor for each pixel. Here, the light concentrating structure receives the light by the subject image and photo-electrically converts the received light to generate signal electric charge, thereby obtaining a pixel signal.

In the CCD or CMOS image sensor in the related art, the light incident to the sensor section is photo-electrically converted by the photodiode, so that the incident light is converted into electric charge to obtain an image signal. Such a device has a structure in which the light is incident for a specific exposure time to be converted into the electric charge and accumulated.

Since the amount of the accumulated electric charge is finite, for example, when the incident light is strong, the electric charge is saturated, so that the grayscale of white and black becomes insufficient. That is, the solid-state imaging device has an incident light amount range for obtaining an appropriate output signal, however the range is remarkably narrow compared with an image pickup target.

Thus, it is desirable to provide a technique which enlarges a dynamic range of a solid-state imaging device.

As a technique of enlarging the dynamic range in the related art, "2005 IEEE Workshop on Charge-Coupled Devices and Advanced Image Sensors P. 169, P. 173" discloses a technique which changes increments of the photoelectric conversion according to the incident light amount. Further, JP-A-2008-167004 discloses a method which sets a gain according to the incident light amount.

Further, JP-A-2006-333439 discloses a solid-state imaging device including a light blocking member which blocks a photoelectric converting section, and an actuator which drives the light blocking member using MEMS.

In addition to these techniques which attempt to enlarge the dynamic range with the device configuration, there are proposed techniques which enlarge the dynamic range using materials.

For example, JP-A-1-75602 and JP-A-9-129859 disclose devices in which an electrochromic material is provided on a package.

Further, JP-A-8-294059 discloses a device in which an electrochromic material is provided over an entire surface of pixels and transmittance is controlled for each pixel.

Further, JP-A-2008-124941 discloses a technique in which an electrochromic material is provided in a pixel area to change transmittance, so as to change the transmittance of visible light and near infrared light.

Further, in view of transmittance control, JP-A-11-234575 discloses a technique in which an accumulation time is variable to increase an apparent dynamic range.

JP-A-2001-352490 discloses a technique which repeatedly reads signals of long and short exposure times to increase the dynamic range.

JP-A-2007-329721 discloses a technique which combines a plurality of signals having different sensitivity for each pixel to enlarge the dynamic range.

For example, in the techniques which enlarge the dynamic range in signal processing using a high sensitivity signal and a low sensitivity signal, as disclosed in JP-A-11-234575, JP-A-2001-352490 and JP-A-2007-329721, as an accumulation time difference is used to obtain the high sensitivity signal and the low sensitivity signal, an image of a moving subject becomes unnatural.

Further, in the technique which employs an ND filter, as disclosed in JP-A-2008-124941, the enlargement factor of the dynamic range is difficult to be changed.

In JP-A-8-294059, a method is disclosed in which the transmittance of the electrochromic material is adjusted by feeding back a pixel output signal for each pixel. According to this technique, the above problems can be solved.

However, in this case, since the time when voltage can be applied to the electrochromic material of each pixel is only time corresponding to the data rate, it is necessary to enhance a frequency characteristic of a feedback system to such a degree. Thus, it is difficult to realize the device. Even if the device can be realized, power consumption becomes increased.

SUMMARY

In the solid-state imaging devices according to the related art, it is difficult to enlarge the dynamic range without the problems of the increase in power consumption, images becoming unnatural and the like.

An embodiment of the present disclosure is directed to a solid-state imaging device including: a semiconductor substrate which includes a light receiving surface which is divided according to pixels arranged in a matrix shape and is formed with a photoelectric converting section; an electrochromic film which is formed on the semiconductor substrate on a light incident path corresponding to the photoelectric converting section, in a portion of pixels selected from the pixels, and has light transmittance changing from a first transmittance to a second transmittance according to voltage applied thereto; a lower electrode which is formed below the electrochromic film; and an upper electrode which is formed above the electrochromic film.

In the solid-state imaging device according to this embodiment, the electrochromic film is formed on the semiconductor substrate including the light receiving surface which is divided according to the pixels arranged in the matrix shape and is formed with the photoelectric converting section, on the light incident path corresponding to the photoelectric converting section, in the portion of pixels selected from the pixels. The electrochromic film has the light transmittance changing from the first transmittance to the second transmittance according to the voltage applied thereto. The lower electrode is formed below the electrochromic film, and the upper electrode is formed above the electrochromic film.

Another embodiment of the present disclosure is directed to a solid-state imaging device including: a semiconductor substrate including a light receiving surface which is divided according to pixels arranged in a matrix shape and is formed with a photoelectric converting section; an electrochromic film which is formed on the semiconductor substrate on a light incident path corresponding to the photoelectric converting section, in at least a portion of the pixels, and has light transmittance changing from a first transmittance to a second transmittance according to voltage applied thereto; a lower electrode which is formed below the electrochromic film; an upper electrode which is formed above the electrochromic film; and a voltage applying section which detects the amount of electric charge accumulated in the photoelectric converting section and applies the voltage to the electrochromic film according to the electric charge amount.

In the solid-state imaging device according to this embodiment, the electrochromic film is formed on the semiconductor substrate including the light receiving surface which is divided according to the pixels arranged in the matrix shape and is formed with the photoelectric converting section, on the light incident path corresponding to the photoelectric converting section, in at least the portion of the pixels. The electrochromic film has the light transmittance changing from the first transmittance to the second transmittance according to the voltage applied thereto. The lower electrode is formed below the electrochromic film, and the upper electrode is formed above the electrochromic film. Further, the voltage applying section is installed which detects the amount of the electric charge accumulated in the photoelectric converting section and applies the voltage to the electrochromic film according to the electric charge amount.

Still another embodiment of the present disclosure is directed to a driving method of a solid-state imaging device, the method including, in a solid-state imaging device including: a semiconductor substrate including a light receiving surface which is divided according to pixels arranged in a matrix shape and is formed with a photoelectric converting section; an electrochromic film which is formed on the semiconductor substrate on a light incident path corresponding to the photoelectric converting section, in a portion of pixels selected from the pixels, and has light transmittance changing from a first transmittance to a second transmittance according to voltage applied thereto; a lower electrode which is formed below the electrochromic film; and an upper electrode which is formed above the electrochromic film, selecting the applied voltage so that the light transmittance of the electrochromic film becomes a predetermined value and applying the voltage to the electrochromic film.

In the driving method according to this embodiment, in the solid-state imaging device in which the electrochromic film is formed on the semiconductor substrate including the light receiving surface which is divided according to the pixels arranged in the matrix shape and is formed with the photoelectric converting section, on the light incident path corresponding to the photoelectric converting section, in the portion of pixels selected from the pixels, the electrochromic film having the light transmittance changing from the first transmittance to the second transmittance according to the voltage applied thereto; the lower electrode is formed below the electrochromic film; and the upper electrode is formed above the electrochromic film, the applied voltage is selected so that the light transmittance of the electrochromic film becomes the predetermined value and the voltage is applied to the electrochromic film.

Yet another embodiment of the present disclosure is directed to a driving method of a solid-state imaging device, the method including, in a solid-state imaging device including a semiconductor substrate including a light receiving surface which is divided according to pixels arranged in a matrix shape and is formed with a photoelectric converting section; an electrochromic film which is formed on the semiconductor substrate on a light incident path corresponding to the photoelectric converting section, in at least a portion of the pixels, and has light transmittance changing from a first transmittance to a second transmittance according to voltage applied thereto; a lower electrode which is formed below the electrochromic film; and an upper electrode which is formed above the electrochromic film, detecting the amount of electric charge accumulated in the photoelectric converting section and applying the voltage to the electrochromic film according to the electric charge amount.

In the driving method according to this embodiment, in the solid-state imaging device in which the electrochromic film is formed on the semiconductor substrate including the light receiving surface which is divided according to the pixels arranged in the matrix shape and is formed with the photoelectric converting section, on the light incident path corresponding to the photoelectric converting section, in at least the portion of the pixels, the electrochromic film having the light transmittance changing from the first transmittance to the second transmittance according to the voltage applied thereto; the lower electrode is formed below the electrochromic film; and the upper electrode is formed above the electrochromic film, the amount of the electric charge accumulated in the photoelectric converting section is detected and the voltage is applied to the electrochromic film according to the electric charge amount.

Still yet another embodiment of the present disclosure is directed to an electronic apparatus including: a solid-state imaging device; an optical system which introduces incident light to an imaging section of the solid-state imaging device; and a signal processing circuit which processes an output signal of the solid-state imaging device. Here, the solid-state imaging device includes: a semiconductor substrate including a light receiving surface which is divided according to pixels arranged in a matrix shape and is formed with a photoelectric converting section; an electrochromic film which is formed on the semiconductor substrate on a light incident path corresponding to the photoelectric converting section, in a portion of pixels selected from the pixels, and has light transmittance changing from a first transmittance to a second transmittance according to voltage applied thereto; a lower electrode which is formed below the electrochromic film; and an upper electrode which is formed above the electrochromic film.

The electronic apparatus according to this embodiment includes the solid-state imaging device; the optical system which introduces the incident light to the imaging section of the solid-state imaging device; and the signal processing circuit which processes the output signal of the solid-state imaging device.

In the solid-state imaging device, the electrochromic film is formed on the semiconductor substrate including the light receiving surface which is divided according to the pixels arranged in the matrix shape and is formed with the photoelectric converting section, on the light incident path corresponding to the photoelectric converting section, in the portion of pixels selected from the pixels, and has the light transmittance changing from the first transmittance to the second transmittance according to the voltage applied thereto. The lower electrode is formed below the electrochromic film, and the upper electrode is formed above the electrochromic film.

Further another embodiment of the present disclosure is directed to an electronic apparatus including: a solid-state imaging device; an optical system which introduces incident light to an imaging section of the solid-state imaging device; and a signal processing circuit which processes an output signal of the solid-state imaging device. Here, the solid-state imaging device includes: a semiconductor substrate including a light receiving surface which is divided according to pixels arranged in a matrix shape and is formed with a photoelectric converting section; an electrochromic film which is formed on the semiconductor substrate on a light incident path corresponding to the photoelectric converting section, in at least a portion of the pixels, and has light transmittance changing from a first transmittance to a second transmittance according to voltage applied thereto; a lower electrode which is formed below the electrochromic film; an upper electrode which is formed above the electrochromic film; and a voltage applying section which detects the amount of electric charge accumulated in the photoelectric converting section and applies the voltage to the electrochromic film according to the electric charge amount.

The electronic apparatus according to this embodiment includes: the solid-state imaging device; the optical system which introduces the incident light to the imaging section of the solid-state imaging device; and the signal processing circuit which processes the output signal of the solid-state imaging device.

In the solid-state imaging device, the electrochromic film is formed on the semiconductor substrate including the light receiving surface which is divided according to the pixels arranged in the matrix shape and is formed with the photoelectric converting section, on the light incident path corresponding to the photoelectric converting section, in at least the portion of the pixels, and has the light transmittance changing from the first transmittance to the second transmittance according to the voltage applied thereto. The lower electrode is formed below the electrochromic film, and the upper electrode is formed above the electrochromic film. Further, there is installed the voltage applying section which detects the amount of the electric charge accumulated in the photoelectric converting section and applies the voltage to the electrochromic film according to the electric charge amount.

According to the solid-state imaging device of some embodiments of the present disclosure, since the electrochromic film is employed, it is possible to enlarge the dynamic range while preventing the problems of the increase in power consumption, images becoming unnatural and the like.

According to the driving method of the solid-state imaging device of some embodiments of the present disclosure, since the voltage is appropriately applied to the electrochromic film, it is possible to drive the solid-state imaging device so as to enlarge the dynamic range while preventing the problems of the increase in power consumption, images becoming unnatural and the like.

According to the electronic apparatus of some embodiments of the present disclosure, it is possible to realize the electronic apparatus in which the dynamic range can be enlarged while preventing the problems of the increase in power consumption, images becoming unnatural and the like.

DETAILED DESCRIPTION

Hereinafter, embodiments of a solid-state imaging device and an electronic apparatus according to the present disclosure will be described with reference to the following drawings.

The description will be made in the following order.
1. First embodiment (a configuration in which an electrochromic film is formed on pixels of a part of a solid-state imaging device having color filters)
2. Second embodiment (a configuration in which a different electrochromic film is formed for each color of color filters in a solid-state imaging device having color filters)
3. Third embodiment (a configuration which is applied to a solid-state imaging device without color filters)
4. Fourth embodiment (a detailed configuration of an electrochromic film)
5. Fifth embodiment (a configuration in which voltage is applied to an electrochromic film according to an electric charge amount for each row of pixels)
6. Sixth embodiment (a configuration in which voltage is applied to an electrochromic film according to an electric charge amount for each pixel)
7. Seventh embodiment (a configuration in which an electrochromic film and a photochromic film are stacked on each other)
8. Eighth embodiment (an application to an electronic apparatus)

First Embodiment

[Configuration of Solid-State Imaging Device]

Figure 1:
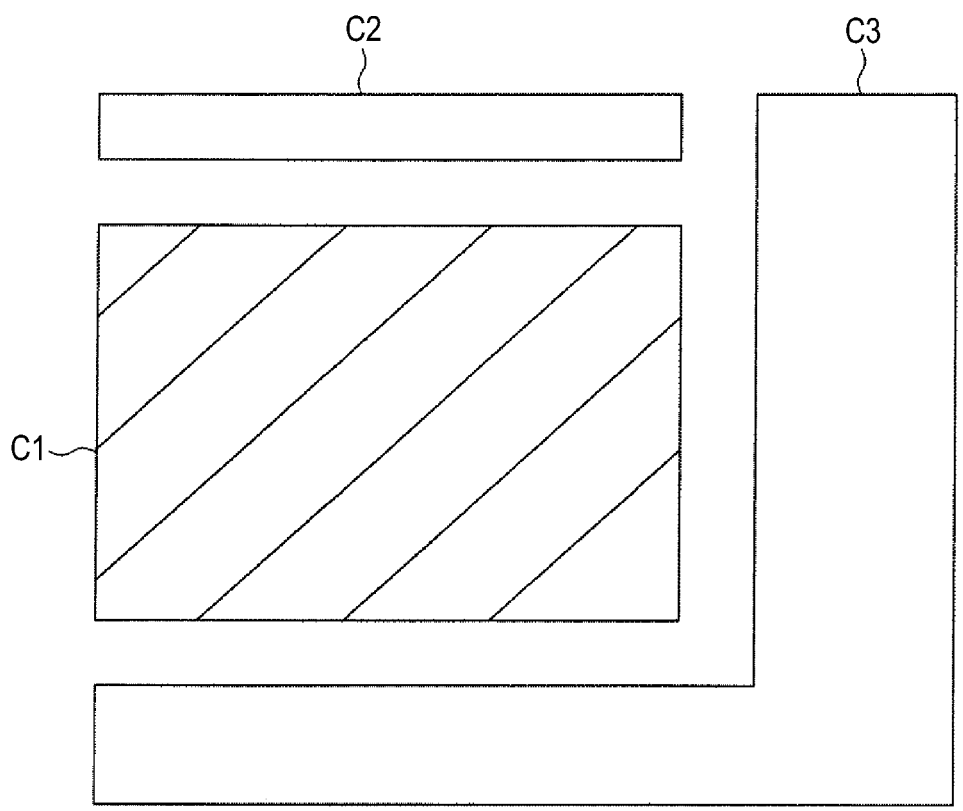
FIG. 1 is a plan view schematically illustrating a solid-state imaging device according to a first embodiment of the present disclosure.

FIG. 1 is a plan view schematically illustrating a solid-state imaging device according to an embodiment of the present disclosure.

For example, a light receiving surface C1 which is divided into pixels arranged in a matrix shape and is formed with a photodiode which is a photoelectric converting section, a driving circuit C2 and a peripheral circuit C3 are formed on a semiconductor substrate. Hereinafter, the photoelectric converting section is representatively referred to as a photodiode.

The driving circuit C2 performs signal processing for driving the pixels formed on the light receiving surface C1, for example.

The peripheral circuit C3 has a configuration in which a variety of circuits is appropriately disposed, and for example, includes a correlated double sampling circuit, an amplifier, an A/D converter, a signal processing circuit for gamma correction, white balance and the like, a clock circuit, and the like.

Figure 2A:
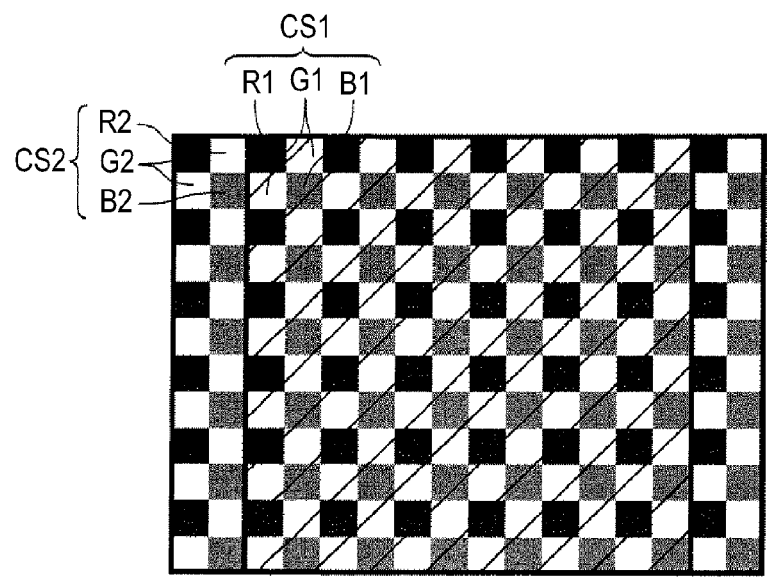
FIG. 2A is a plan view schematically illustrating a layout of a light receiving surface of the solid-state imaging device according to the first embodiment of the present disclosure.
Figure 2B:
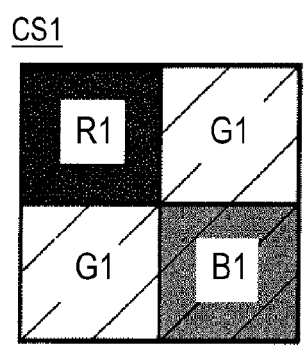
FIGS. 2B and 2C are enlarged views of a part of the light receiving surface in FIG. 2A.
Figure 2C:
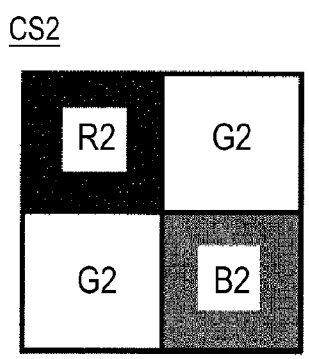

FIG. 2A is a plan view schematically illustrating a layout of alight receiving surface of the solid-state imaging device according to the present embodiment, and FIGS. 2B and 2C are partially enlarged views of the light receiving surface in FIG. 2A.

In this embodiment, there are provided pixel sets CS1 including red pixels R1, green pixels G1 and blue pixels B1 which have an electrochromic film, and pixels sets CS2 including red pixels R2, green pixels G2 and blue pixels B2 which do not have the electrochromic film.

Each of the pixel sets CS1 and the pixel sets CS2 includes one red pixel, two green pixels and one blue pixel.

FIG. 2B is an enlarged view of the pixel set CS1, in which the pixel set CS1 includes the red pixel R1 and the green pixels G1 and the blue pixel B1 having the electrochromic film.

FIG. 2C is an enlarged view of the pixel set CS2, in which the pixel set CS2 includes the red pixel R2 and the green pixels G2 and the blue pixel B2 without the electrochromic film.

In this embodiment, the pixel sets CS1 are disposed in a center part of the light receiving surface, and the pixel sets CS2 are disposed in a peripheral part of the light receiving surface.

Figure 3A:
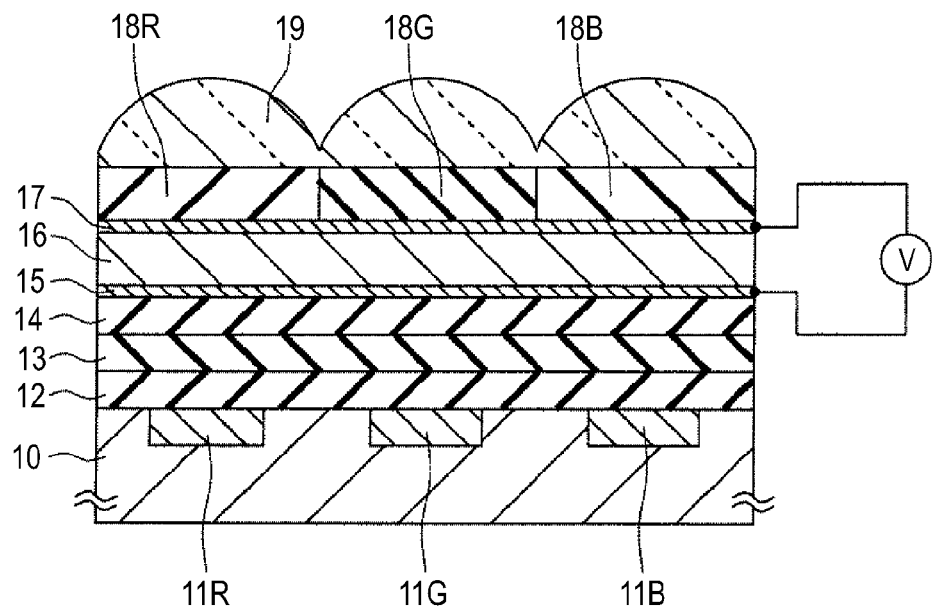
FIGS. 3A and 3B are sectional views schematically illustrating the solid-state imaging device according to the first embodiment of the present disclosure.
Figure 3B:
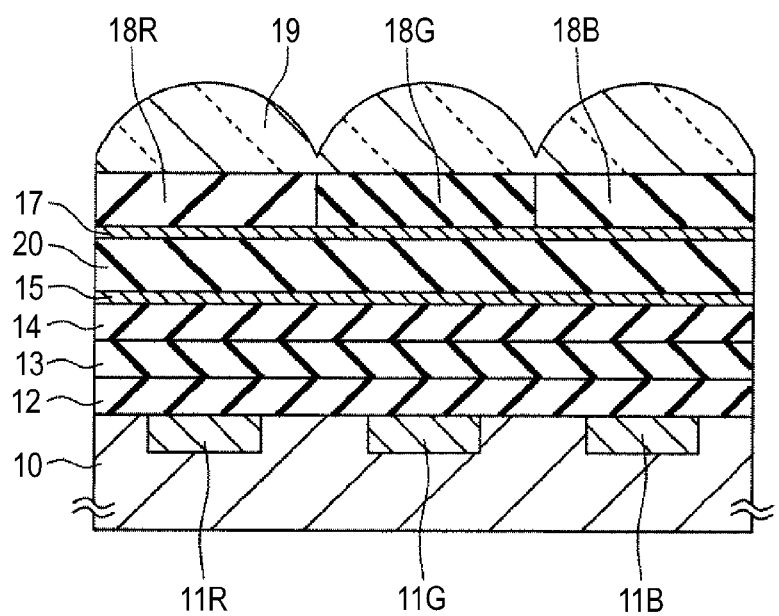

FIGS. 3A and 3B are sectional views schematically illustrating the solid-state imaging device according to the present embodiment.

FIG. 3A is a sectional view in the pixel set CS1, that is, the red pixel R1, the green pixels G1 and the blue pixel B1.

For example, on the semiconductor substrate 10 are formed photodiodes 11R, 11G and 11B which are divided according to the respective pixels of the red pixel R1 and the green pixels G1 and the blue pixel B1 which are formed in a matrix shape and serves as photoelectric converting sections in the respective red pixel, green pixels and blue pixel.

For example, a first insulation film 12 made of oxide silicon, nitride silicon, resin, a stacked body thereof, or the like is formed on an entire surface of the semiconductor substrate 10 to cover the photodiodes 11R, 11G, 11B and the like.

For example, a second insulation film 13 made of silicon oxynitrided or the like is formed on the first insulation film 12.

For example, a third insulation film 14 made of nitride silicon or the like is formed on the second insulation film 13.

For example, a lower electrode 15, an electrochromic film 16, an upper electrode 17 are formed on the third insulation film 14.

The lower electrode 15 and the upper electrode 17 are transparent electrodes made of ITO (indium tin oxide), or nano-carbon material such as graphene, carbon nanotubes or the like, for example.

The electrochromic film 16 is formed on a light incident path for the photodiodes 11, and includes an electrochromic material in which light transmittance is changed according to voltage applied thereto. Here, the light transmittance is changed from a first transmittance to a second transmittance according to the applied voltage.

Characteristics of the electrochromic material which forms the electrochromic film, the light transmission and the like will be described later.

For example, color filters 18R, 18G and 18B corresponding to respective colors are formed on the upper electrode 17, and an on-chip-lens 19 is formed thereon.

FIG. 3B is a sectional view in the pixel set CS2, that is, the red pixel R2, the green pixels G2 and the blue pixel B2.

The configuration in FIG. 3B is substantially the same as the configuration in FIG. 3A, but is different therefrom in that the electrochromic film 16 is not formed.

In the pixel set CS2, a planarizing film 20 which mitigates a step caused due to the thickness of the electrochromic film 16 is formed.

The planarizing film 20 is made of resin such as a polystyrene resin or an acryl resin, or the like in which the light transmittance thereof is approximately zero in a visible light region.

In the sectional view of FIG. 3B, the lower electrode 15 and the upper electrode 17 are included in the pixel set CS2, but the lower electrode 15 and the upper electrode 17 may be omitted in the pixel of the pixel set CS2.

Figure 4:
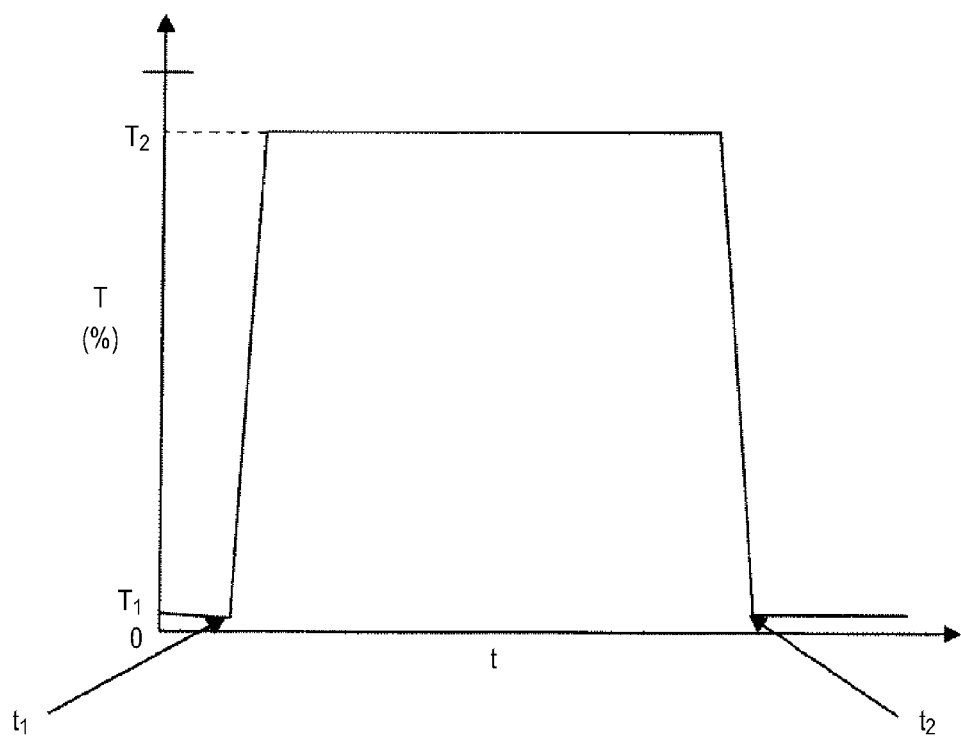
FIG. 4 is a graph illustrating a time response characteristic of light transmittance of an electrochromic film of the solid-state imaging device according to the first embodiment of the present disclosure.

FIG. 4 is a graph illustrating a time response characteristic of the light transmittance of the electrochromic film of the solid-state imaging device according to the present embodiment.

As shown in FIG. 4, for example, if a positive voltage is applied from a ground electric potential at a time point $t_1$, the light transmittance increases from a first transmittance $T_1$ to a second transmittance $T_2$. Further, if the positive voltage returns to a negative electric potential at the time point $t_2$, for example, the light transmittance decreases from the second transmittance $T_2$ to return to the first light transmittance $T_1$.

Details of the characteristics in FIG. 4 are determined according to the configuration and material of the electrochromic film, the applied voltage as described above, and the like.

Further, the time necessary for changing the light transmittance of the electrochromic film from the first transmittance to the second transmittance according to the applied voltage to the electrochromic film is also determined according to the configuration and material of the electrochromic film, the above-described applied voltage, and the like. It is preferable that the time required for the change of the first transmittance to the second transmittance is shorter than one second.

Figure 5:
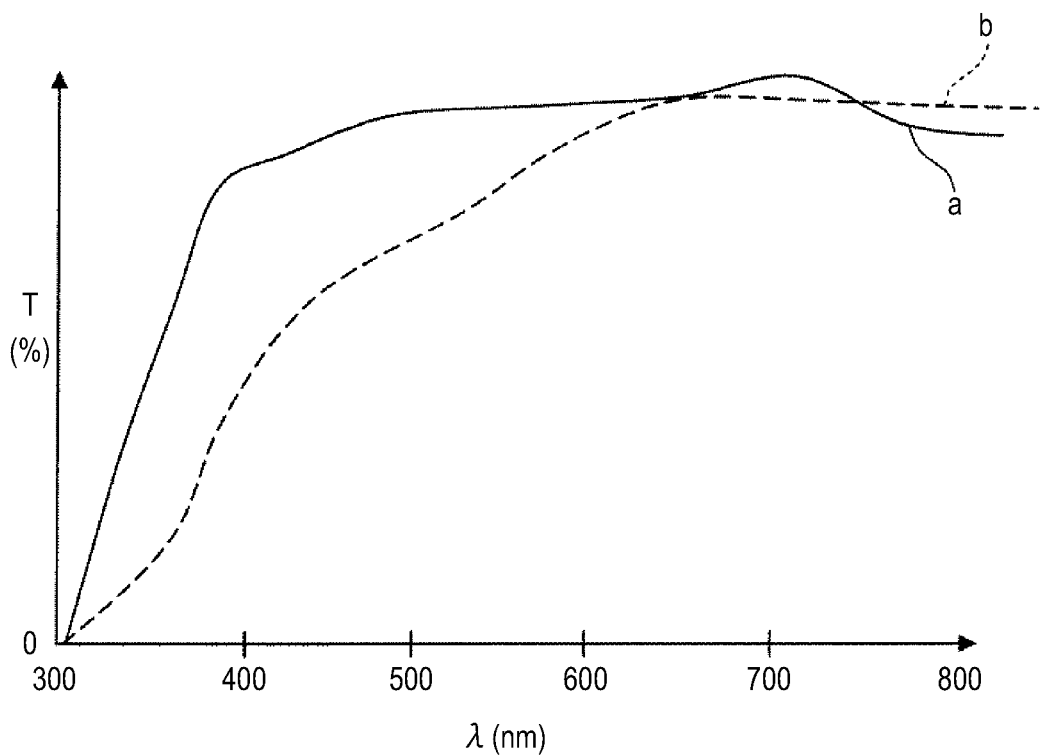
FIG. 5 is a graph illustrating an example of wavelength dependency of light transmittance of the electrochromic film of the solid-state imaging device according to the first embodiment of the present disclosure.

FIG. 5 is a graph illustrating an example of wavelength dependency (light transmittance spectrum) of the light transmittance of the electrochromic film of the solid-state imaging device according to the first embodiment of the present disclosure.

In FIG. 5, the electrochromic film has different materials in a solid line "a" and a dashed line "b".

Further, with respect to the wavelength dependency of the light transmittance, it is preferable that the change in the light transmittance is uniform in a visible light region.

As an example of the above-mentioned material, for example, a material including tungsten oxide may be used. In the electrochromic material using tungsten oxide, the time required for changing the light transmittance from the first transmittance to the second transmittance is shorter than one second.

Further, it is known that tungsten oxide causes a uniform change in the light transmittance while having some inclination over an entire visible light region, and thus, tungsten oxide can be preferably used.

Further, magnesium-titanium alloy, magnesium-nickel alloy or the like may be also preferably used.

As materials of the lower electrode 15 and the upper electrode 17, indium tin oxide (ITO) which is generally used as a transparent electrode material may be used. However, since it is difficult to realize the light transmittance of ITO of 90% or higher, there is a problem in that the light transmittance may be reduced in a bright image pickup scene. In this case, nano-carbon material such as graphene or carbon nanotubes having the light transmittance of 95% or higher can be used as the transparent electrode material, to thereby solve the problem of the light transmittance reduction.

[Enlargement of Dynamic Range]

Figure 6A:
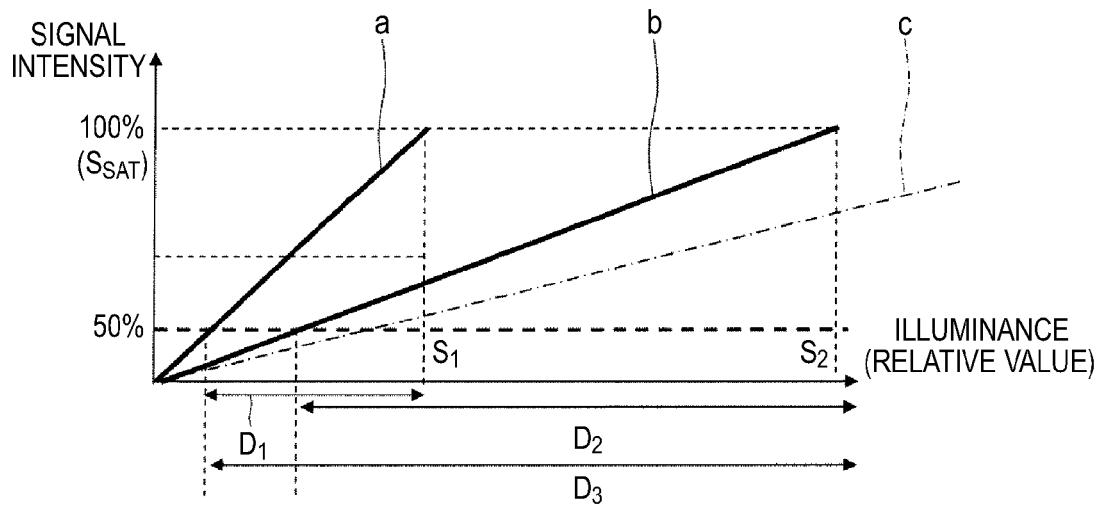
FIGS. 6A and 6B are diagrams schematically illustrating the reason that a dynamic range of the solid-state imaging device according to the first embodiment of the present disclosure is enlarged.
Figure 6B:
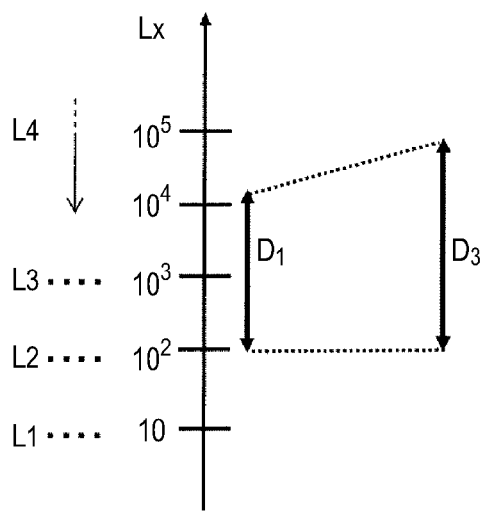

FIGS. 6A and 6B are diagrams schematically illustrating the reason that a dynamic range of the solid-state imaging device according to the present embodiment is enlarged.

FIG. 6A illustrates an output signal intensity of a pixel in response to the illuminance of light which irradiates the pixel. In the figure, a high sensitivity signal-illuminance curve "a" corresponds to a pixel in which the electrochromic film is not formed or a pixel which has a pixel electrochromic film in which the light transmittance is not reduced without applying voltage thereto. A low sensitivity signal-illuminance curve "b" corresponds to a pixel in which an electrochromic film is formed and the light transmittance is reduced by applying voltage thereto. It is assumed that the electrochromic film has the light transmittance of 50%, for example.

Like the curve "a" in FIG. 6A, in a case where the photochromic film is not formed, the signal intensity reaches 100% (saturation signal $S_{SAT}$) in the luminance $S_1$ to be saturated. A dynamic range is expressed as $D_1$ in the case of the curve "a".

However, in the curve "b" in which the photochromic film is formed, the light transmittance is reduced, and for example, the signal intensity reaches only 50% of the saturation signal intensity in the luminance $S_1$. The signal intensity reaches 100% (saturation signal $S_{SAT}$) in the luminance $S_2$. However, since in reality there is noise, the signal of the low illuminance side is blended in the noise. A dynamic range in the case of the curve "b" is expressed as $D_2$.

Thus, the signals of the high sensitivity pixel and the low sensitivity pixel are combined. That is, the output of the high illuminance side is compensated in the curve "a" (dynamic range $D_1$) of the high sensitivity signal, and the output of the low illuminance side is compensated in the curve "b" (dynamic range $D_2$) of the low sensitivity signal, respectively. As a result, the dynamic range becomes $D_3$. When $D_3$ is compared with $D_1$ and $D_2$, it can be seen that the dynamic range is enlarged by combining the low sensitivity signal and the high sensitivity signal.

It is preferable that a pixel which gives the output of the high sensitivity signal for the low illuminance side does not have the electrochromic film. This is because two types of voltages should be otherwise applied to the electrochromic film and wirings for applying the voltages to the electrochromic film are complicated.

Further, in the pixel without the electrochromic film, it is possible to omit the upper electrode and the lower electrode formed above and below the electrochromic film, and to use different transparent materials instead, thereby making it possible to remove a step with respect to the pixels having the electrodes to secure the planarization property.

The low sensitivity signal-illuminance curve "b" is used for the output of high illuminance, and the inclination of the low sensitivity signal-illuminance curve "b" becomes gentle to such a degree that the output signal of the high illuminance side is not saturated.

In the solid-state imaging device according to the present embodiment, as both of the pixel having the electrochromic film and the pixel without the electrochromic film are provided, it is possible to obtain both of the high sensitivity signal-illuminance curve and the low sensitivity signal-illuminance curve "b". As both curves are used, the dynamic range can be enlarged.

Further, since the enlargement factor of an optimal dynamic range is determined according to scenes, it is preferable that the inclination of the low sensitivity signal-illuminance curve "b" is variable.

For example, as shown as a signal-illuminance curve "c" in the present embodiment in FIG. 6A, it is preferable that the inclination of the graph of the signal intensity to the illuminance can be changed by the applied voltage, with respect to the signal-illuminance curve "b".

As the inclination of the graph of the signal intensity to the illuminance is changed, it is possible to change the enlargement factor of the dynamic range.

Further, if a sufficient change occurs in the light transmittance of the electrochromic film when the voltage applied to the electrochromic film is in the range of 1 to 3V which is an electric potential used in general pixel reading, it is not necessary to install a special device for the voltage applied to the electrochromic film.

In this case, it is possible to apply the voltage to the electrochromic film by a transistor located in a peripheral section of a field angle of an image sensor chip. In this case, the voltage applied to the electrochromic film is common over the entire electrochromic film, however different voltages may be applied to the electrochromic film using a different transistor.

FIG. 6B illustrates the dynamic range which can be enlarged in the solid-state imaging device according to the present embodiment in the unit of illuminance (Lx). For example, $L1(10^1 Lx)$ corresponds to the illuminance level of a candle, $Ls(10^2 Lx)$ corresponds to the illuminance level of a white lamp, $L3(10^3 Lx)$ corresponds to the illuminance level of a fluorescent lamp, and $L4$ ($10^{14} Lx$ or higher) corresponds to the illuminance level of the sun.

That is, in a case where image pickup can be performed in the illuminance range of about $10^1 Lx$ to $10^4 Lx$ by the solid-state imaging device in the related art, if the solid-state imaging device according to the present embodiment is used, it is possible to perform image pickup under the conditions of the illuminance of the sun or higher ($10^{14} Lx$ or higher).

In a general scene capable of corresponding to the dynamic range of a solid-state imaging device, the enlargement of the dynamic range is not necessary. On the other hand, since the dynamic range of a subject is large when an environment of the image pickup is excessively bright (under strong sunlight, on a snowy mountain, at sea on a clear day, or the like), the dynamic range is set to be large for the image pickup.

The solid-state imaging device according to the present embodiment can be designed so that a user can select the enlargement factor of the dynamic range by the scope of the dynamic range of the subject. For example, the electric potential according to the enlargement factor selected by the user is applied to the electrochromic film, to change the light transmittance of the electrochromic film. The enlargement factor (corresponding to the inclination of the signal-illuminance curve in FIG. 6A) may be continuously changed, for example.

The solid-state imaging device according to the present embodiment can realize a transmittance control corresponding to a frame rate of the imaging device. Further, since manufacturing specifications such as heat resistance or endurance are satisfied, the amount of light incident to the pixels can be adjusted by the above-mentioned materials.

Consequently, it is possible to control the saturation light amount of the sensor and to enlarge the dynamic range. Further, since the inclination of the relationship between the illuminance and the signal intensity is changed according to the applied voltage, it is possible to change the enlargement factor of the dynamic range.

According to the solid-state imaging device of the present embodiment, it is possible to enlarge the dynamic range with a configuration using the electrochromic film while preventing problems such as increase in power consumption, images becoming unnatural, and the like.

As the electrochromic film according to the present embodiment, all materials indicating an electrochromic response, such as a film formed of an electrochromic material, material obtained by adding the electrochromic material to a general resin film, or the like, may be used.

As the materials of the lower electrode 15 and the upper electrode 17, indium tin oxide (ITO) generally used as a transparent electrode material may be used. However, since it is difficult to realize the transmittance of 90% or higher with ITO, there may be a problem in that the transmittance is reduced in a bright image pickup scene. In this case, it is possible to solve the problem of the transmittance reduction by using nano-carbon material such as graphene or carbon nanotubes having the transmittance of 95% or higher as the transparent electrode material.

[Driving Method of Solid-Imaging Device]

A driving method of a solid-state imaging device according to the present embodiment is a method of driving the solid-state imaging device having the above-mentioned configuration.

The applied voltage is selected so that the light transmittance of the electrochromic film becomes a predetermined value, and is applied to the electrochromic film.

According to the driving method of the solid-state imaging device according to the present embodiment, it is possible to enlarge the dynamic range while preventing problems such as increase in power consumption, images becoming unnatural, and the like.

[Manufacturing Method of Solid-State Imaging Device]

Hereinafter, a method of manufacturing the solid-state imaging device according to the present embodiment will be described.

Firstly, for example, on the semiconductor substrate 10 photodiodes 11R, 11G and 11B are formed which are divided according to the respective pixels of the red pixel R1 and the green pixels G1 and the blue pixel B1 which are formed in a matrix shape and serves as photoelectric converting sections in the respective red pixel, green pixels and blue pixel.

Then, for example, the first insulation film 12 made of oxide silicon, nitride silicon, resin, a stacked body thereof, or the like is formed on the entire surface of the semiconductor 10 using a CVD (Chemical Vapor Deposition) method or the like to cover the photodiodes 11R, 11G and 11B, and the like.

Then, for example, the second insulation film 13 made of silicon oxynitrided or the like is formed on the first insulation film 12 using the CVD method or the like.

Next, for example, the third insulation film 14 made of nitride silicon or the like is formed on the second insulation film 13 using the CVD method or the like.

Then, for example, a film made of ITO, or nano carbon material such as graphene or carbon nanotubes, or the like is formed on the third insulation film 14 using a sputtering method or the like to form the lower electrode 15.

Then, for example, the electrochromic film 16 including an electrochromic material such as tungsten oxide is formed on the lower electrode 15 using the CVD method or the like.

Then, a resist film which protects a region of the pixel sets CS1 having the electrochromic film and opens a region of the pixel sets CS2 without the electrochromic film are patternformed, and then, a dry etching process or the like is performed. Thus, the electrochromic film 16 in the region of the pixel sets CS2 is removed.

Then, for example, a film made of resin such as polystyrene resin or acryl resin is formed, the resin formed in the region of the pixel sets CS1 having the electrochromic film is removed, and then the planarizing film 20 is formed therein. The planarizing film 20 is formed to have approximately the same thickness as that of the electrochromic film 16.

Next, for example, a film made of ITO, or nano carbon material such as graphene or carbon nanotubes is formed on the electrochromic film 16 and the planarizing film 20 using a sputtering method or the like, to thereby form the upper electrode 17.

Then, for example, the color filters 18R, 18G and 18B of respective colors are formed on the upper electrode 17, and then, the on-chip-lens 19 is formed thereon.

In this way, the solid-state imaging device according to the present embodiment can be manufactured.

[Modification of Pixel Layout]

In this embodiment, the pattern of the pixel sets CS1 having the photochromic film and the pixel sets CS2 without the photochromic film may have the following layout.

Figure 7:
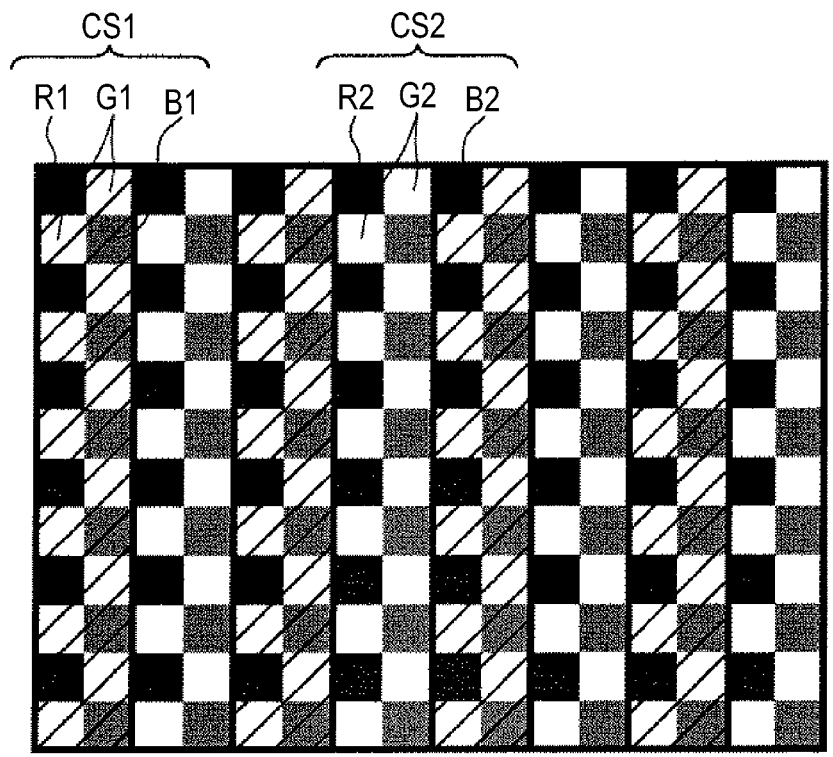
FIG. 7 is a sectional view schematically illustrating a layout of the light receiving surface of the solid-state imaging device according to the first embodiment of the present disclosure.

FIG. 7 is a sectional view schematically illustrating a layout of the solid-state imaging device according to the present embodiment.

In this embodiment, the pixel sets CS1 having the photochromic film and the pixel sets CS2 without the photochromic film are alternately arranged for each pixel group including two rows of pixels.

In this way, the pixel group includes the pixels which are arranged in a plurality of rows, and a common photochromic film is formed for each pixel group.

Figure 8:
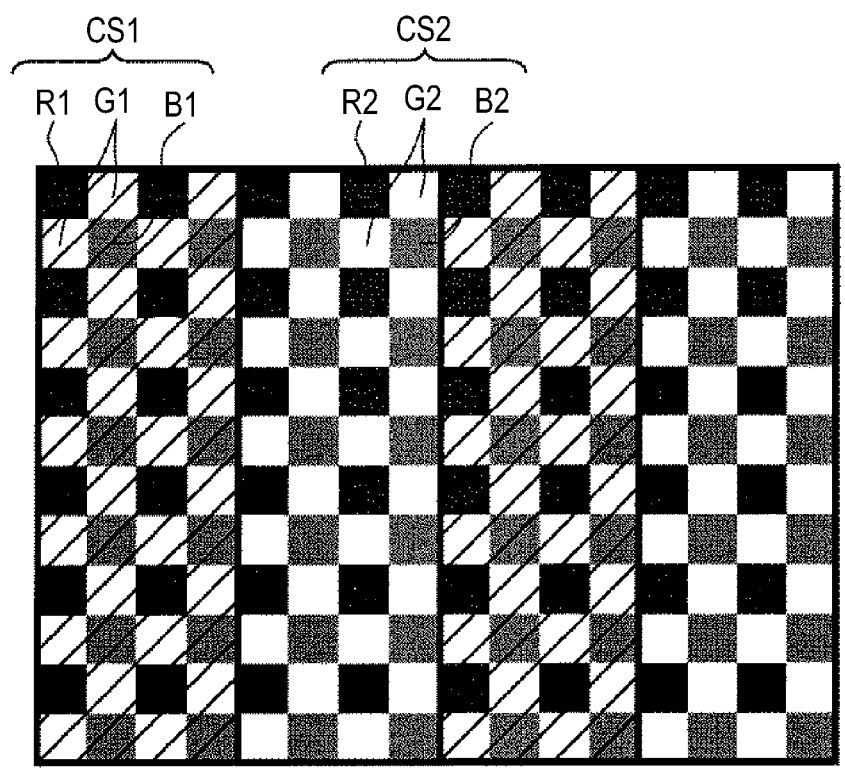
FIG. 8 is a sectional view schematically illustrating a layout of the light receiving surface of the solid-state imaging device according to the first embodiment of the present disclosure.

FIG. 8 is a sectional view schematically illustrating a layout and a configuration of the solid-state imaging device according to the present embodiment.

In this embodiment, the pixel sets CS1 having the photochromic film and the pixel sets CS2 without the photochromic film are alternately arranged for each pixel group including four rows of pixels.

In this way, the pixel group includes the pixels which are arranged in a plurality of rows, and a common photochromic film is formed for each pixel group.

Figure 9:
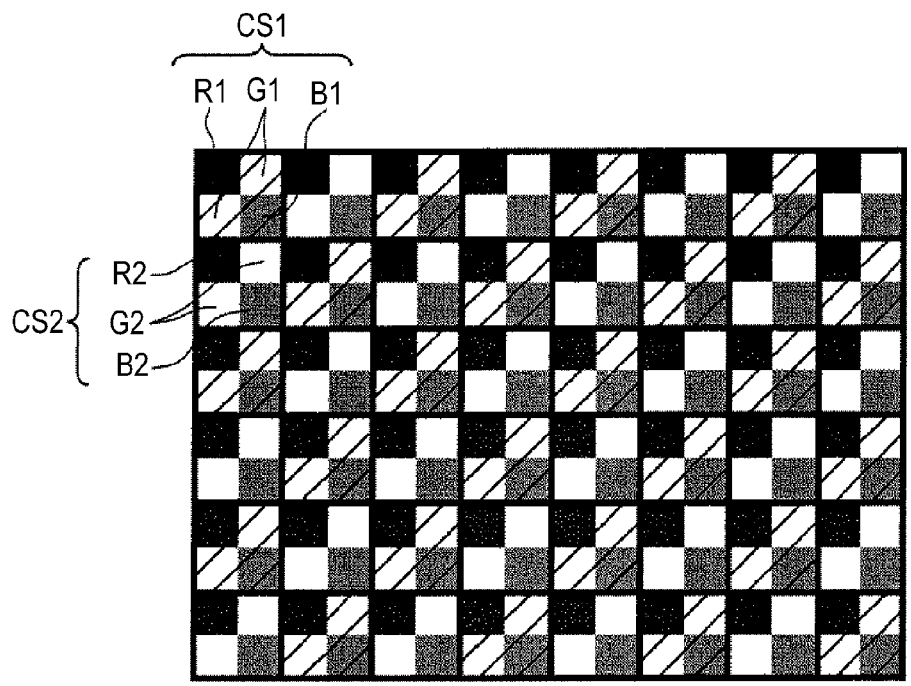
FIG. 9 is a sectional view schematically illustrating a layout of the light receiving surface of the solid-state imaging device according to the first embodiment of the present disclosure.

FIG. 9 is a sectional view schematically illustrating a layout and a configuration of the solid-state imaging device according to the present embodiment.

In this embodiment, the pixel sets CS1 and the pixel sets CS2 are alternately arranged in a horizontal direction and in a vertical direction, respectively.

That is, for each pixel set including four pixels called a Bayer arrangement of one red pixel R, two green pixels G and one blue pixel B, the pixel sets CS1 having the photochromic film and the pixel sets CS2 without the photochromic film are alternately arranged.

According to the solid-state imaging device according to the present embodiment, the photochromic film has the light transmittance which is changed according to the amount of the incident light, and obtains two outputs of high sensitivity and low sensitivity. The light transmittance is reduced at high illuminance and is increased at low illuminance. It is possible to obtain two types of low sensitivity signal and high sensitivity signal. Accordingly, the dynamic range can be enlarged in the same way as in the first embodiment.

Second Embodiment

[Configuration of Solid-State Imaging Device]

Figure 10:
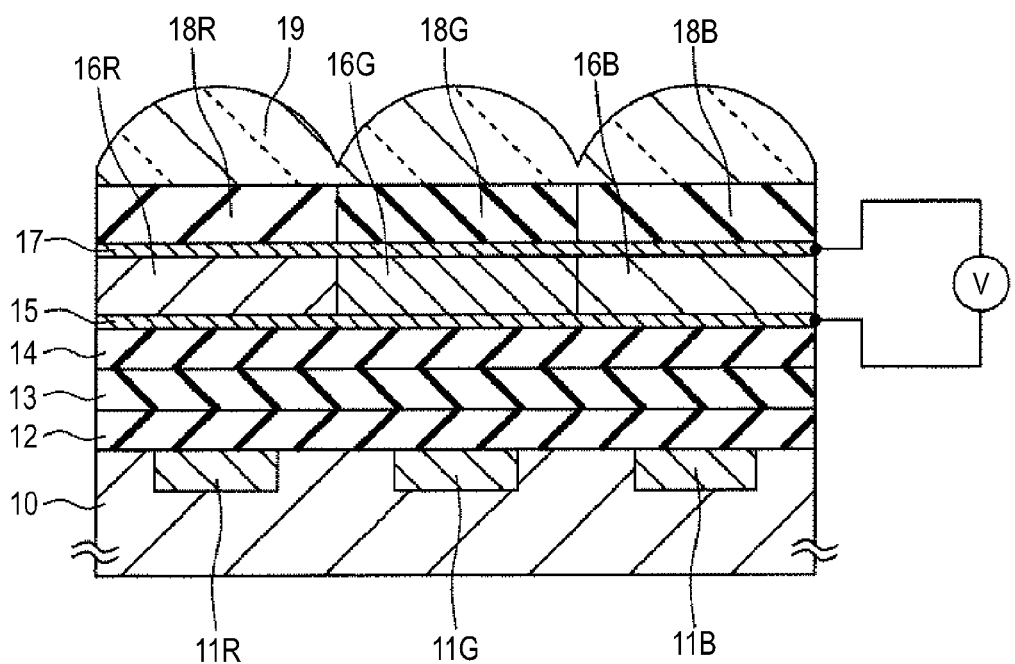
FIG. 10 is a sectional view schematically illustrating a solid-state imaging device according to a second embodiment of the present disclosure.

FIG. 10 is a sectional view schematically illustrating a solid-state imaging device according to the present embodiment.

The configuration of the second embodiment is the same as that of the first embodiment, but is different therefrom in that different electrochromic films are formed for each color of the color filters.

That is, in the solid-state imaging device according to the present embodiment, a red pixel electrochromic film 16R, a green pixel electrochromic film 16G and a blue pixel electrochromic film 16B which are divided according to the respective pixels of the red pixel R1 and the green pixels G1 and the blue pixel B1 are formed.

The light transmittance of the electrochromic film may be changed according to the wavelength as shown in FIG. 5, and thus, an electrochromic material which causes change in the light transmittance suitable for each pixel of the red pixel R1 and the green pixels G1 and the blue pixel B1 may be used.

According to the solid-state imaging device of the present embodiment, it is possible to enlarge the dynamic range with a configuration using the electrochromic film while preventing problems such as increase in power consumption, images becoming unnatural, and the like in a similar way to the first embodiment.

As the materials of the lower electrode 15 and the upper electrode 17, indium tin oxide (ITO) generally used as a transparent electrode material may be used. However, since it is difficult to realize the transmittance of 90% or higher with ITO, there may be a problem in that the transmittance is reduced in a bright image pickup scene. In this case, it is possible to solve the problem of the transmittance reduction by using nano-carbon material such as graphene or carbon nanotubes having the transmittance of 95% or higher as the transparent electrode material.

[Manufacturing Method of Solid-State Imaging Device]

Hereinafter, a method of manufacturing the solid-state imaging device according to the present embodiment will be described.

FIGS. 11A, 11B, 12A and 12B are sectional views schematically illustrating a manufacturing process in the manufacturing method of the solid-state imaging device according to the present embodiment.

Figure 11A:
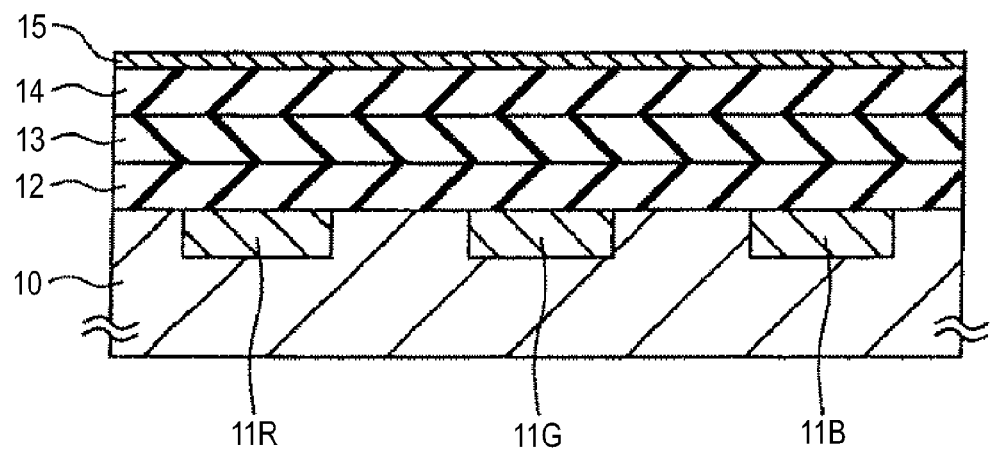
FIGS. 11A and 11B are sectional views schematically illustrating a manufacturing process in a manufacturing method of the solid-state imaging device according to the second embodiment of the present disclosure.

Firstly, as shown in FIG. 11A, for example, on a semiconductor substrate 10 photodiodes 11R, 11G and 11B are formed which are divided according to the respective pixels of the red pixel R1, the green pixels G1, and the blue pixel B1 which are arranged in a matrix shape in the respective red pixel, green pixels and blue pixel.

Then, for example, a first insulation film 12 made of oxide silicon, nitride silicon, resin, a stacked body thereof, or the like is formed on the entire surface of the semiconductor 10 using a CVD (Chemical Vapor Deposition) method or the like to cover the photodiodes 11R, 11G and 11B, and the like.

Then, for example, a second insulation film 13 made of silicon oxynitrided or the like is formed on the first insulation film 12 using the CVD method or the like.

For example, a third insulation film 14 made of nitride silicon or the like is formed on the second insulation film 13 using the CVD method or the like.

Then, for example, a film made of ITO, or nano carbon material such as graphene or carbon nanotubes is formed on the third insulation film 14 using a sputtering method or the like to form the lower electrode 15.

Figure 11B:
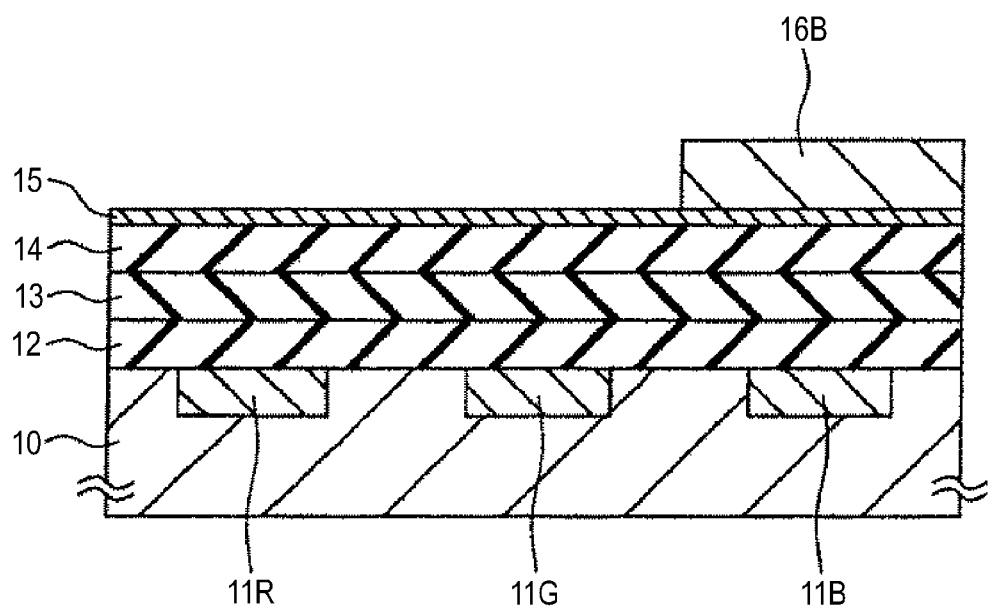

As shown in FIG. 11B, for example, a blue pixel electrochromic film 16B is formed on the lower electrode 15, using the CVD method or the like, a resist film which opens a region other than the blue pixels is pattern-formed, and then, a dry etching process or the like is performed.

Thus, the blue pixel electrochromic film 16B is formed only in the region of the blue pixels.

Figure 12A:
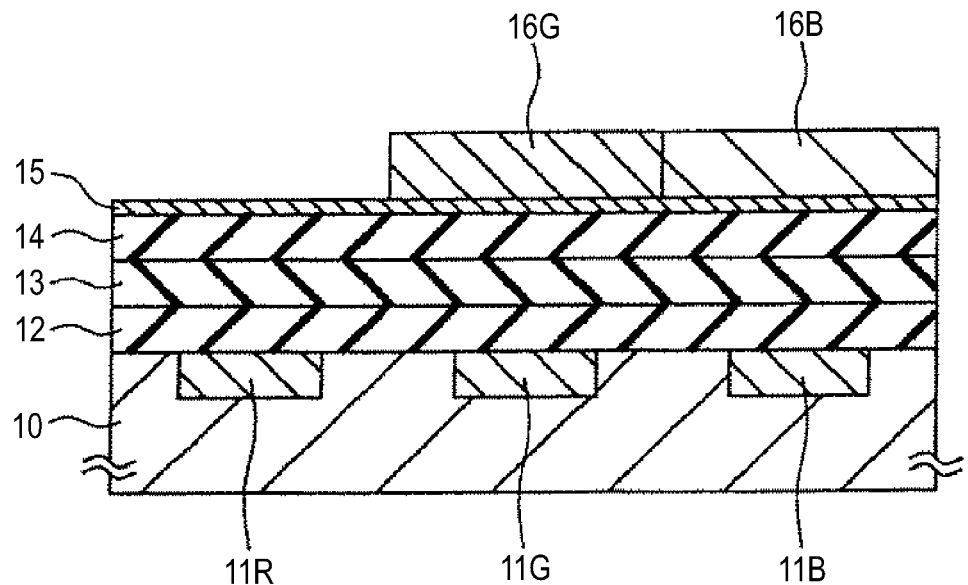
FIGS. 12A and 12B are sectional views schematically illustrating a manufacturing process in the manufacturing method of the solid-state imaging device according to the second embodiment of the present disclosure.

Then, as shown in FIG. 12A, for example, a green pixel electrochromic film 16G is formed on the lower electrode 15 and the blue pixel electrochromic film 16B, using the CVD method or the like.

Then, a resist film which opens a region other than the green pixels is pattern-formed, and then, a dry etching process or the like is performed.

Thus, the green pixel electrochromic film 16G is formed only in the region of the green pixels.

Figure 12B:
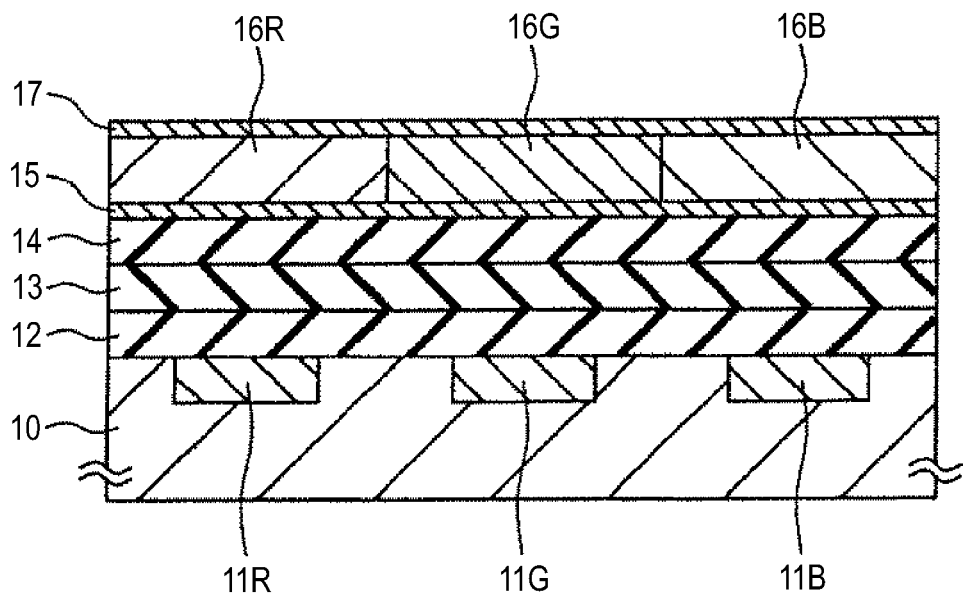

Then, as shown in FIG. 12B, for example, a red pixel electrochromic film 16R is formed on the lower electrode 15, the blue pixel electrochromic film 16B and the green pixel electrochromic film 16G, using the CVD method or the like.

Then, a resist film which opens a region other than the red pixels is pattern-formed, and then, a dry etching process or the like is performed.

Thus, the red pixel electrochromic film 16R is formed only in the region of the red pixels.

Then, for example, a film made of ITO, or nano carbon material such as graphene or carbon nanotubes is formed on the electrochromic films 16B, 16G and 16R for the respective color pixels using the sputtering method or the like, to thereby form an upper electrode 17.

In the subsequent processes, for example, the color filters 18R, 18G and 18B of the respective colors are formed on the upper electrode 17, and the on-chip-lens 19 if formed thereon, in a similar way to the first embodiment.

In this way, the solid-state imaging device according to the present embodiment can be manufactured.

Third Embodiment

[Configuration of Solid-State Imaging Device]

Figure 13:
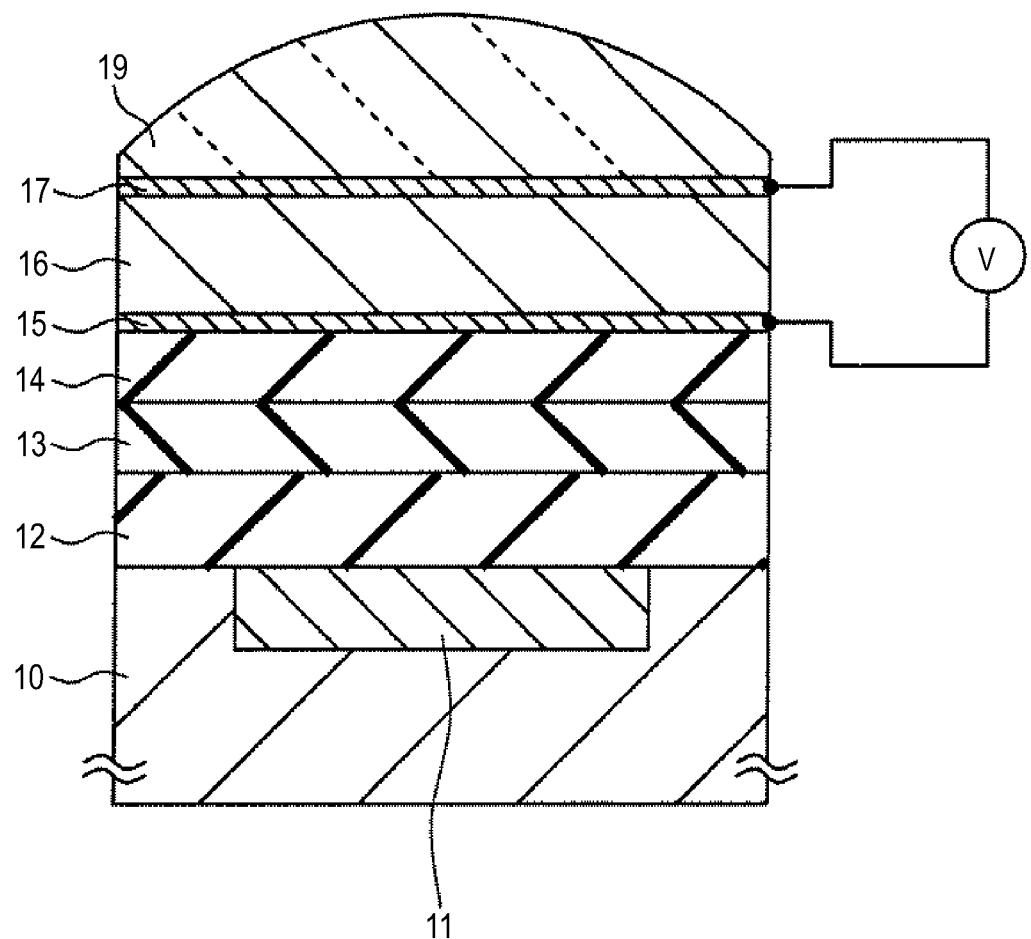
FIG. 13 is a sectional view schematically illustrating a solid-state imaging device according to a third embodiment of the present disclosure.

FIG. 13 is a sectional view schematically illustrating a solid-state imaging device according to the present embodiment.

The configuration of the solid-state imaging device in the present embodiment is substantially the same as the configuration of the solid-state imaging device in the first embodiment, but is different therefrom in that the color filters are not installed on the pixels.

That is, in the solid-state imaging device according to the present embodiment, the electrochromic film 16 is formed in some pixels of a solid-state imaging device for monochromic image pickup.

According to the solid-state imaging device of the present embodiment, it is possible to enlarge the dynamic range with a configuration using the electrochromic film while preventing problems such as increase in power consumption, images becoming unnatural, and the like, in a similar way to the first embodiment.

As the materials of the lower electrode 15 and the upper electrode 17, indium tin oxide (ITO) generally used as a transparent electrode material may be used. However, since it is difficult to realize the transmittance of 90% or higher with ITO, there may be a problem in that the transmittance is reduced in a bright image pickup scene. In this case, it is possible to solve the problem of the transmittance reduction by using nano-carbon material such as graphene or carbon nanotubes having the transmittance of 95% or higher as the transparent electrode material.

Fourth Embodiment

[Configuration of Solid-State Imaging Device]

Figure 14:
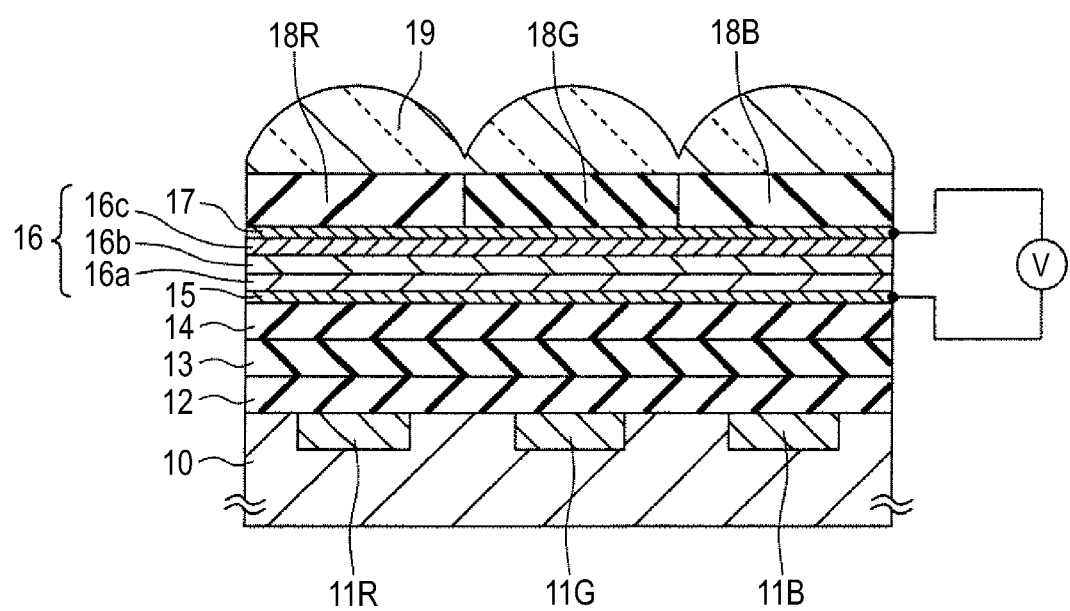
FIG. 14 is a sectional view schematically illustrating a solid-state imaging device according to a fourth embodiment of the present disclosure.

FIG. 14 is a sectional view schematically illustrating a solid-state imaging device according to the present embodiment.

The configuration of the solid-state imaging device in the present embodiment is substantially the same as the configuration of the solid-state imaging device in the first embodiment, but is different therefrom in that the electrochromic film 16 is a stacked body including an electrochromic material layer 16a, a solid electrolyte layer 16b and an ion storage layer 16c.

An electrochromic material such as oxide tungsten is included in the electrochromic material layer 16a, and thus, it is possible to realize the electrochromic film in which the light transmittance is changed according to voltage applied to thereto.

According to the solid-state imaging device of the present embodiment, it is possible to enlarge the dynamic range with a configuration using the electrochromic film while preventing problems such as increase in power consumption, images becoming unnatural, and the like, in a similar way to the first embodiment.

The present embodiment can be supplied to the solid-state imaging devices according to the first to third embodiments.

As the materials of the lower electrode 15 and the upper electrode 17, indium tin oxide (ITO) generally used as a transparent electrode material may be used. However, since it is difficult to realize the transmittance of 90% or higher with ITO, there may be a problem in that the transmittance is reduced in a bright image pickup scene. In this case, it is possible to solve the problem of the transmittance reduction by using nano-carbon material such as graphene or carbon nanotubes having the transmittance of 95% or higher as the transparent electrode material.

Fifth Embodiment

[Configuration of Solid-State Imaging Device]

Figure 15A:
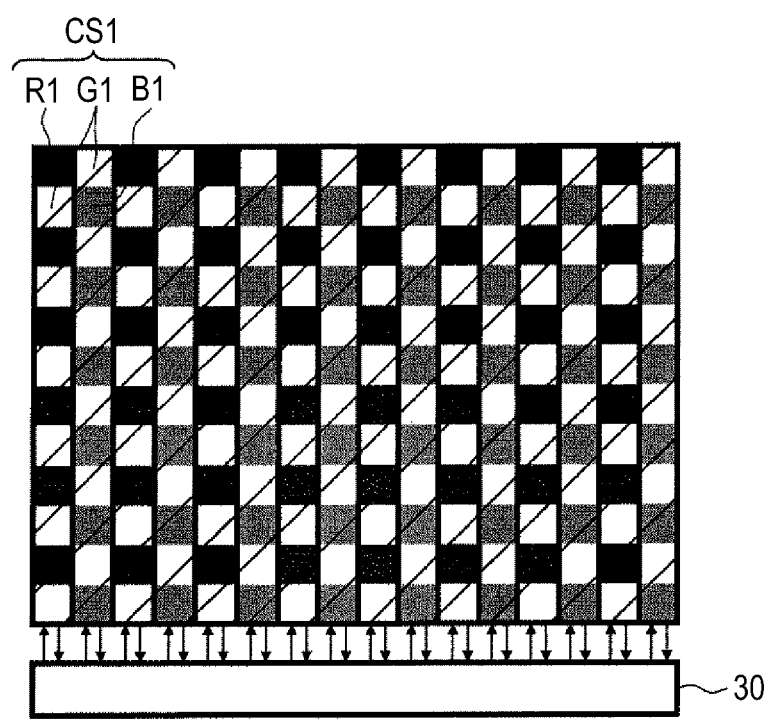
FIG. 15A is a plan view schematically illustrating a layout of a light receiving surface of a solid-state imaging device according to a fifth embodiment of the present disclosure.

FIG. 15A is a plan view schematically illustrating a layout of a light receiving surface of a solid-state imaging device according to the present embodiment.

In this embodiment, the pixel sets CS1 including the red pixel R1, the green pixels G1 and the blue pixel B1 which have an electrochromic film are disposed over the entire surface of the light receiving surface.

Further, voltage is applied to the electrochromic film according to the electric charge amount for each pixel row.

In this embodiment, for example, an electric charge detecting section 30 which detects the amount of electric charge accumulated in the photodiode with respect to each pixel is installed, and a voltage applying section 31 which applies the voltage to the electrochromic film 16 according to the amount of electric charge is installed for each pixel row including the plurality of pixels. The voltage applying section 31 may be referred to as an electrochromic film driving section since the voltage applying section 31 applies the voltage to the electrochromic film.

Figure 15B:
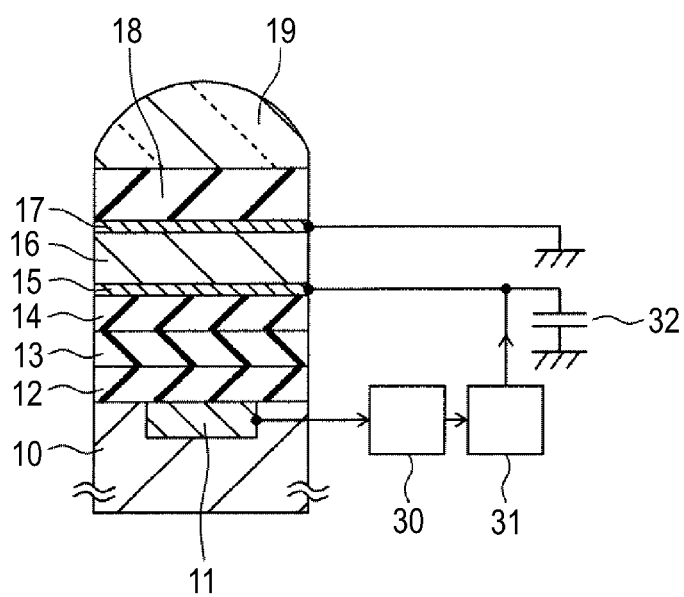
FIG. 15B is a sectional view thereof.

FIG. 15B is a sectional view schematically illustrating a solid-state imaging device according to the present embodiment.

In this embodiment, since the red pixel, the green pixels and the blue pixel have substantially the same configuration, the red pixel, the green pixels and the blue pixel are illustrated as a common configuration.

For example, on the semiconductor substrate 10 photodiodes 11 are formed which are divided according to the respective pixels of the red pixel R1 and the green pixels G1 and the blue pixel B1 which are arranged in a matrix shape and serve as photodiodes in the respective red pixel, green pixels and blue pixel.

For example, a first insulation film 12 made of oxide silicon, nitride silicon, resin, a stacked body thereof, or the like is formed on the entire surface of the semiconductor substrate 10 to cover the photodiode 11.

For example, a second insulation film 13 made of silicon oxynitrided or the like is formed on the first insulation film 12.

For example, a third insulation film 14 made of nitride silicon or the like is formed on the second insulation film 13.

For example, a lower electrode 15, an electrochromic film 16, an upper electrode 17 are stacked on the third insulation film 14.

The lower electrode 15 and the upper electrode 17 are transparent electrodes made of ITO (indium tin oxide), or nano-carbon material such as graphene or carbon nanotubes, or the like, for example.

The electrochromic film 16 has the same configuration as in the first embodiment.

The electrochromic film 16 is formed on alight incident path for the photodiode 11, and includes an electrochromic material in which light transmittance is changed according to voltage applied thereto. Here, the light transmittance is changed from a first transmittance to a second transmittance according to the applied voltage.

It is preferable that the time required for changing the light transmittance from the first transmittance to the second transmittance be shorter than one second, in the electrochromic film 16.

As an example of the above-mentioned material, a material including tungsten oxide may be used, for example.

For example, a color filter 18 of each color is formed on the upper electrode 17, and an on-chip lens 19 is formed thereon.

In this embodiment, the electric charge detecting section 30 which detects the amount of electric charge accumulated in the photodiode 11 is installed in each pixel.

Here, the electric charge detecting section 30 includes an impure substance region which is formed on the semiconductor substrate and is called a floating diffusion, and a transistor called a source follower, for example.

Further, the voltage applying section 31 which applies the voltage to the electrochromic film 16 is installed for each pixel row including the plurality of pixels, according to the amount of electric charge detected by the electric charge detecting section 30.

Further, the voltage applying section 31 sets the voltage to be applied to the electrochromic film 16 according to the amount of the electric charge accumulated in the photodiode 11 and applies the voltage. For example, the voltage applying section 31 calculates the sum of the amounts of the electric charge accumulated in the pixels which form a pixel row, for each pixel row, and sets the voltage according the calculation result.

Here, the voltage applying section 31 includes an amplifying circuit or the like, for example.

With such a configuration, as the light transmittance of the electrochromic film is reduced before the photodiode 11 is saturated, the light incident to the photodiode is reduced. Thus, the saturation light amount can be increased.

Further, a voltage retaining section 32 which retains the voltage applied to the electrochromic film 16 is connected to the voltage applying section 31.

The voltage retaining section 32 is formed of an electrostatic capacitative element, for example. The voltage retaining section 32 is not necessary if the electrochromic film 16 has a characteristic of maintaining the electric potential for a necessary time.

In the solid-state imaging device according to the present embodiment, the transmittance of the electrochromic film 16 is determined on the basis of the amount of the electric charge accumulated in the photodiode 11 of the pixel.

Further, for example, with respect to the pixel row including the plurality of pixels, the electric charge detecting section 30 which detects the amount of electric charge accumulated in the photodiode may be installed, and the voltage applying section 31 which applies the voltage to the electrochromic film 16 according to the amount of the electric charge may be installed for each pixel row.

In this case, for example, a source terminal of a source follower of each pixel which forms the pixel row is connected to one electric charge detecting section and one voltage applying section. Further, a predetermined voltage is applied from one voltage applying section to the electrochromic film of each pixel for each pixel row.

In a case where the voltage applied to the electrochromic film of all the pixels is generated by one electric charge detecting section and one voltage applying section, the time when the voltage can be applied to the electrochromic film of each pixel is only time corresponding to the data rate. Thus, it is necessary to increase a frequency characteristic of a feedback system, and thus, there is a problem that its realization is difficult or power consumption is increased even though the realization is performed.

In contrast, this embodiment employs a method in which reading of output signal voltage and amplification of the signal voltage are performed in a row unit, and thus, the voltage is applied to the electrochromic film in the row unit. Thus, the time when the voltage can be applied to the electrochromic film can be set to be long as 1H. Thus, the frequency characteristic of the feedback system can be set in a low state to such a degree, and thus, the power consumption is considerably reduced compared with the related art method. Accordingly, it is possible to realize a device with a high dynamic range and low power consumption.

In this embodiment, an electrochromic film driving circuit is installed for each row, but if the voltage applying section is installed for the entirety of each row, the area of the voltage applying section may be increased. In this case, a setting method may be determined in consideration of balance with the power consumption reduction effect, for example, the voltage applying section may be installed for each of a plurality of rows.

Further, by changing the amplification factor of an amplification circuit which forms the voltage applying section installed in each pixel row, it is possible to change the enlargement factor of the dynamic range, in a similar way to the first embodiment.

According to the solid-state imaging device in this embodiment, it is possible to enlarge the dynamic range with a configuration using the electrochromic film while preventing problems such as increase in power consumption, images becoming unnatural, and the like.

This embodiment may be applied to a monochromic device without a color filter.

As the electrochromic film according to the present embodiment, all materials indicating an electrochromic response, such as a film formed of an electrochromic material, material obtained by adding the electrochromic material to a general resin film, or the like, may be used.

As the materials of the lower electrode 15 and the upper electrode 17, indium tin oxide (ITO) generally used as a transparent electrode material may be used. However, since it is difficult to realize the transmittance of 90% or higher with ITO, there may be a problem in that the transmittance is reduced in a bright image pickup scene. In this case, it is possible to solve the problem of the transmittance reduction by using nano-carbon material such as graphene or carbon nanotubes having the transmittance of 95% or higher as the transparent electrode material.

[Driving Method of Solid-Imaging Device]

A driving method of a solid-state imaging device according to this embodiment is a method of driving the solid-state imaging device having the above-mentioned configuration.

In the solid-state image pickup apparatus according to the above-described embodiment, the electric charge accumulated in the photodiode 11 is detected, and the voltage is applied to the electrochromic film 16 according to the amount of the electric charge.

In this embodiment, the voltage is applied to the electrochromic film for each pixel row including the plurality of pixels, according to the amount of electric charge.

According to the driving method of the solid-state imaging device in this embodiment, it is possible to enlarge the dynamic range while preventing the problems of the increase in power consumption, images becoming unnatural, and the like.

Sixth Embodiment

[Configuration of Solid-State Imaging Device]

Figure 16:
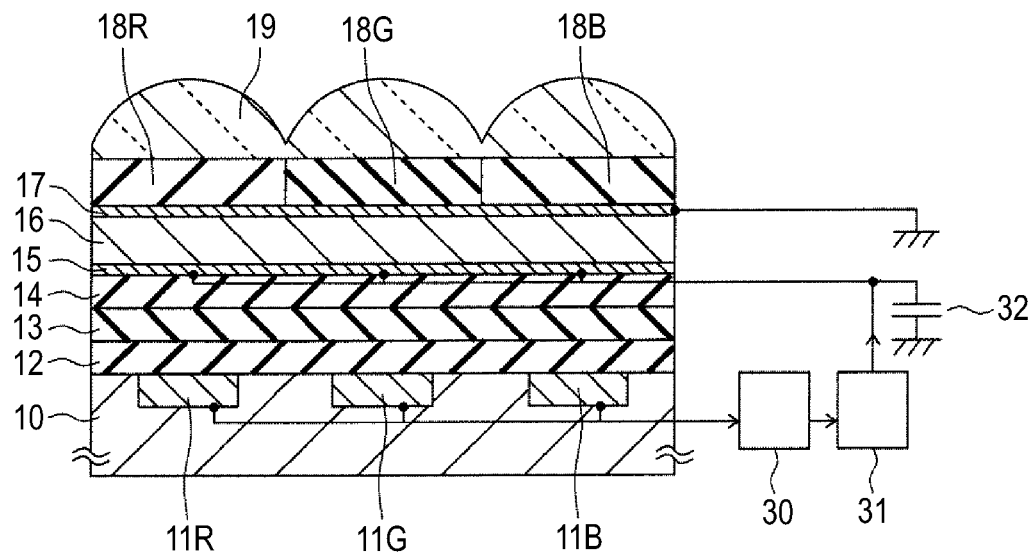
FIG. 16 is a sectional view schematically illustrating a solid-state imaging device according to a sixth embodiment of the present disclosure.

FIG. 16 is a sectional view schematically illustrating a solid-state imaging device according to the present embodiment.

The sixth embodiment has the same configuration as that of the fifth embodiment, but is different therefrom in that voltage is applied to the electrochromic film according to the amount of the electric charge for each pixel.

In FIG. 16, the red pixel, the green pixels and the blue pixel are differently shown, and voltage is applied to the electrochromic film 16 from the voltage applying section 31 in each pixel.

In the figures, the electrochromic film 16 is integrally formed over the pixels, but may be divided for each pixel as necessary.

In the related art, in a case where voltage applied to the electrochromic film of all pixels is generated in one electric charge detecting section and one voltage applying section, the time when the voltage can be applied to the electrochromic film of each pixel is only time corresponding to the data rate. Thus, it is necessary to enhance a frequency characteristic of the feedback system. Thus, it is difficult to realize the device. Even if the device can be realized, power consumption becomes increased.

In order to solve the above-mentioned problems, in this embodiment, as feedback is performed in the pixel unit, for example, the light transmittance of the electrochromic film is controlled in the pixel unit.

In this case, voltage is applied to the electrochromic film for each pixel so as to change the transmittance of the electrochromic film of each pixel. In a case where voltage is normally applied to the electrochromic film of each pixel, for example, even in a case where the reading voltage is 1V, electric current flowing at that time corresponds to multiple times of the total pixel number, and the applied voltage becomes several hundred V or higher.

In this embodiment, for example, the time when the voltage is applied to the electrochromic film of each pixel using line selection pulses is set to be short as 1 H. Thus, it is possible to shorten the time when the voltage is applied to the electrochromic film of each pixel, and to narrow the band of an electrochromic film driving circuit for feedback. Thus, the power consumption is considerably reduced compared with the related art method.

This embodiment is different from the fifth embodiment in that the voltage applying section 31 is installed for each pixel in order to further enhance the effect of the low consumption power.

In FIG. 16, the output side of the electric charge detecting section 30 connected to each pixel is connected to the voltage applying section 31, to apply the voltage to the electrochromic film.

An output signal of each pixel is detected by the electric charge detecting section 30, and monitored by the voltage applying section 31 to be amplified, and thus, the voltage to be applied to the electrochromic film 16 is determined.

In this embodiment, the settling time of a wiring for reading the signal voltage from each pixel for each pixel row or a vertical feedback wiring for feeding back the output signal on the electrochromic film for each pixel row, which is necessary in the fifth embodiment, is not necessary.

The frequency characteristic of the voltage applying section 31 for driving the electrochromic film can be set to be low to such a degree, and the consumption power is further reduced compared with the fifth embodiment.

Further, as described in the fifth embodiment, in a case where increase in the occupying area of the voltage applying section is concerned, the voltage applying section may be installed in the unit of a plurality of pixels or partially removed from an unnecessary location, instead of installing the voltage applying sections for all the pixels. The voltage applying section may be installed in appropriate locations with an optimal number for image quality, power consumption and the occupying area of the voltage applying section. The appropriate location refers to uniform arrangement of the voltage applying section in effective pixel regions, in a case where the number is limited in consideration of power consumption.

Further, in a similar way to the fifth embodiment, by changing the amplification factor of the amplifying circuit which forms the voltage applying section installed in the pixel row, it is possible to change the enlargement factor of the dynamic range in a similar way to the first embodiment.

As the materials of the lower electrode 15 and the upper electrode 17, indium tin oxide (ITO) which is generally used as a transparent electrode material may be used. However, since it is difficult to realize the light transmittance of 90% or higher with ITO, the light transmittance may be reduced in a bright image pickup scene. In this case, nano-carbon material such as graphene or carbon nanotubes having the light transmittance of 95% or higher can be used as the transparent electrode material, to thereby solve the problem of the light transmittance reduction.

Seventh Embodiment

[Configuration of Solid-State Imaging Device]

Figure 17:
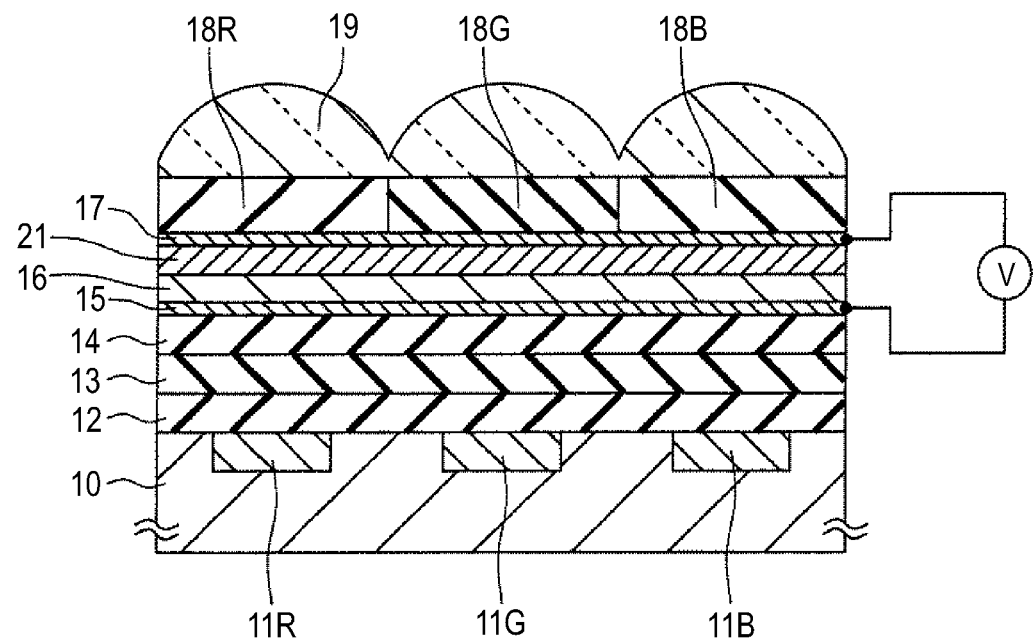
FIG. 17 is a sectional view schematically illustrating a solid-state imaging device according to a seventh embodiment of the present disclosure.

FIG. 17 is a sectional view schematically illustrating a solid-state imaging device according to this embodiment.

The seventh embodiment has the same configuration as that of the first embodiment, but is different therefrom in that a photochromic film 21 which is stacked on the electrochromic film 16 and has a light transmittance changing from a third transmittance to a fourth transmittance according to the light incident amount is provided between the lower electrode 15 and the upper electrode 17.

The electrochromic film may have the same configuration as the first embodiment.

Further, as material which forms the photochromic film, for example, hexabisimidazole derivatives may be used.

Next, adjustment of the light transmittance due to the electrochromic film and the photochromic film will be described.

The amount of electric charge accumulated in the photodiode of each pixel of effective pixels is read by the pixel signal reading circuit, and its average value is calculated, and thus, the light transmittance to be set to the electrochromic film is determined according to the value. In order to attain the obtained light transmittance, a necessary voltage is applied to the entire pixel region. This functions as an auto iris for light incident to the effective pixels.

Then, the light which passes through the electrochromic film and the photochromic film is incident to each pixel. Here, the photochromic film reacts with the light incident to each pixel, and thus, its light transmittance is changed.

In the solid-state imaging device according to this embodiment, firstly, since the auto iris is installed, it is possible to increase the saturation illuminance of each pixel. Further, it is possible to increase the grayscale on the high illuminance side, compared with the device in which the photochromic film is solely used, by the dynamic range enlargement effect due to the photochromic film.

As described above, it is possible to enlarge the dynamic range on the high illuminance side without affecting the sensitivity on the low illuminance side by using the solid-state imaging device according to this embodiment.

Figure 18A:
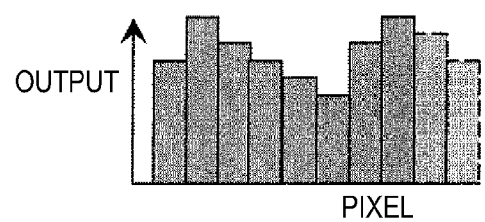
FIGS. 18A to 18C are diagrams schematically illustrating outputs of pixels of the solid-state imaging device according to the seventh embodiment of the present disclosure.
Figure 18B:
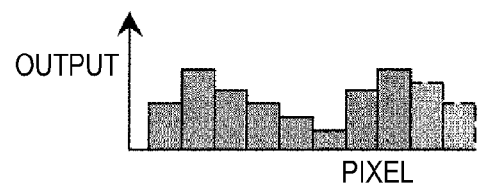
Figure 18C:
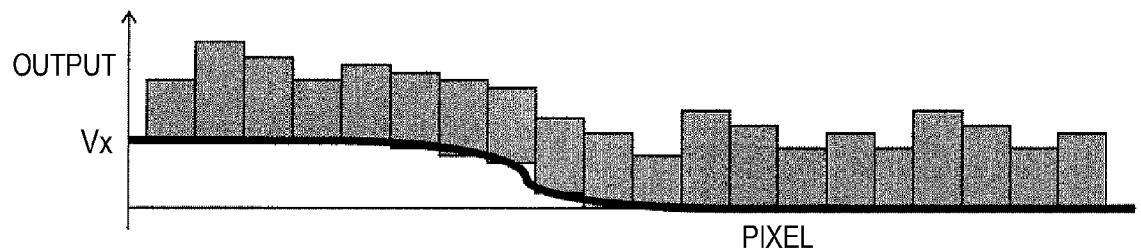

FIGS. 18A to 18C are diagrams schematically illustrating outputs of pixels of a solid-state imaging device according to this embodiment.

FIGS. 18A to 18C illustrate an output of respective pixels in bright and dark scenes.

FIG. 18A illustrates an output of the pixels in a bright scene, and FIG. 18B illustrates an output of the pixels in a dark scene, respectively.

As shown in the figures, since the output levels are different from each other in bright and dark scenes, a non-linear correction process is generally performed in signal processing if a contrasting section is present in the same field angle.

In this embodiment, it is possible to improve the non-linearlity of the signal.

For example, the left side in FIG. 18C represents an output signal in brightness, and the right side therein represents an output signal in darkness. The difference between the left output signal and the right output signal is generally compensated by the non-linear process, however in this embodiment, as shown in FIG. 18C, a reference electric potential is set according to the incident light amount, and the output signals are continuous.

Since the non-linearlity in the signal steps is compensated, it is possible to prevent image flickering or the like, and to obtain an image with high definition for a moving image.

In the solid-state imaging device according to this embodiment, at least one electrochromic film driving circuit is sufficient to realize the function.

Further, if the final sensor output obtained in consideration of the transmittance of the photochromic film corresponds to the signal processing using the relationship between the light amount of the photochromic material and the transmittance thereof, it is not necessary to provide an additional device, and there is no concern about the power consumption or occupying area.

The photochromic material and the electrochromic material used in this embodiment is not limited to a multi-layered film including hexabisimidazole derivatives or oxide tungsten, respectively, and any kind of material may be used as long as the desired function can be obtained.

Further, in FIG. 17, the photochromic film 21 is installed between the electrochromic film 16 and the upper electrode 17, but this is not limitative. Further, the photochromic film 21 may be installed in any position of the light incident path for the photodiodes.

According to the solid-state imaging device in this embodiment, in a similar way to the first embodiment, it is possible to enlarge the dynamic range with a configuration using the electrochromic film while preventing problems such as increase in power consumption, images becoming unnatural, and the like.

The present embodiment may be applied to the solid-state imaging devices according to the first to sixth embodiments.

As the materials of the lower electrode 15 and the upper electrode 17, indium tin oxide (ITO) generally used as a transparent electrode material may be used. However, since it is difficult to realize the transmittance of 90% or higher with ITO, there may be a problem in that the transmittance is reduced in a bright image pickup scene. In this case, it is possible to solve the problem of the transmittance reduction by using nano-carbon material such as graphene or carbon nanotubes having the transmittance of 95% or higher as the transparent electrode material.

Eighth Embodiment

[Application to Electronic Apparatus]

Figure 19:
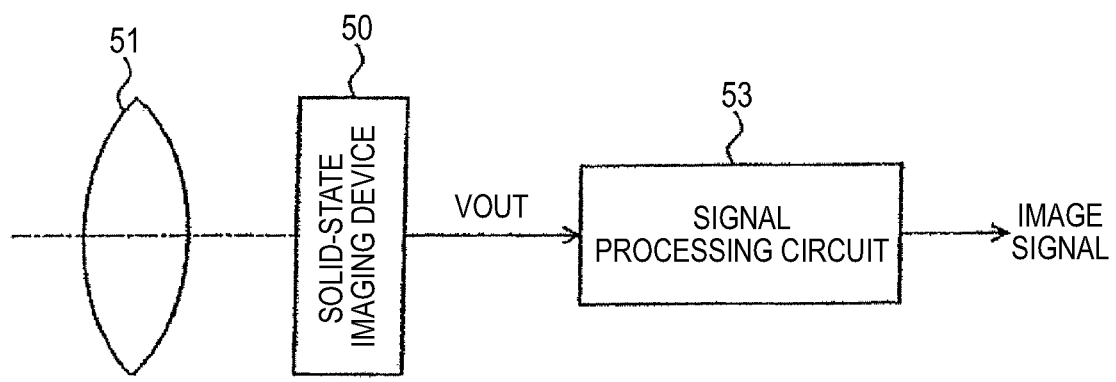
FIG. 19 is a diagram schematically illustrating a configuration of an electronic apparatus according to an eighth embodiment of the present disclosure.

FIG. 19 is a diagram schematically illustrating a configuration of an electronic apparatus according to the present embodiment. The electronic apparatus in this embodiment is an example of a video electronic device for a still image pickup or a moving image pickup.

The electronic apparatus according to this embodiment includes an image sensor (solid-imaging device) 50, an optical system 51, a signal processing circuit 53, and the like.

In this embodiment, as the image sensor 50, the solid-state imaging device according to the first embodiment is employed.

The optical system 51 image-forms image light (incident light) from a subject on an image pickup surface of the image sensor 50. Thus, corresponding signal electric charge is accumulated inside the image sensor 50 for a predetermined time. The accumulated signal electric charge is extracted as an output signal Vout.

A shutter device controls a light irradiation time and a light blocking time to the image sensor 50.

An image processing section supplies a driving signal which controls a transmission operation of the image sensor 50 and a shutter operation of the shutter device. By the driving signal (timing signal) supplied from the image processing section, the signal transmission of the image sensor 50 is performed. The signal processing circuit 53 performs various signal processings for the output signal Vout of the image sensor 50 to output the result as an image signal. The image signal in which the signal processings are performed is stored in a storage medium such as a memory, or is output to a monitor.

According to the electronic apparatus in this embodiment, it is possible to reduce variation in the light interference intensity of light incident to the light receiving surface, and to control color unevenness, for example, in an electronic apparatus having the solid-state imaging device which picks up color images of the generation particularly having a cell pitch of 3 μm or less.

The present embodiment may be applied to the solid-state imaging devices according to the first to the seventh embodiments.

As the materials of the lower electrode 15 and the upper electrode 17, indium tin oxide (ITO) generally used as a transparent electrode material may be used. However, since it is difficult to realize the transmittance of 90% or higher with ITO, there may be a problem in that the transmittance is reduced in a bright image pickup scene. In this case, it is possible to solve the problem of the transmittance reduction by using nano-carbon material such as graphene or carbon nanotubes having the transmittance of 95% or higher as the transparent electrode material.

Further, the present disclosure is not limited to the application to a solid-state imaging device which detects distribution of the incident light amount of visible light to form an image, and may be applied to a solid-state imaging device which picks up distribution of the incident amount of infrared light, X-rays or particles as an image, a general solid-state imaging device (physical amount distribution detecting device) such as a fingerprint detecting sensor which detects distribution of a different physical amount such as pressure, electrostatic capacitance to form an image, or the like.

Further, the present disclosure is not limited to the application to the solid-state imaging device, and may be applied to a digital still electronic device, a video electronic device, an electronic apparatus having an image pickup function such as a mobile phone, or the like. Further, a modular type, that is, an electronic device module which is mounted on the electronic apparatus may be used as the imaging device.

In the imaging device such as a video electronic device, a digital still electronic device, or an electronic device module for a mobile device such as a mobile phone, the image sensor 50 according to the above-described embodiments may be used as the solid-state imaging device.

The present disclosure is not limited the above-mentioned description.

For example, the present embodiments may be applied to either a CMOS sensor or a CCD device.

Further, a variety of modifications may be made in a range without departing from the spirit of the present disclosure.

The present disclosure contains subject matter related to those disclosed in Japanese Priority Patent Applications JP 2010-172755 and JP 2010-209113 filed in the Japan Patent Office on Jul. 30, 2010 and Sep. 17, 2010, respectively, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a semiconductor substrate including a light receiving surface (i) divided according to pixels arranged in a matrix shape, and (ii) formed with a photoelectric converting section;
   an electrochromic film (i) formed on the semiconductor substrate on a light incident path corresponding to the photoelectric converting section, in a portion of the pixels, and (ii) having light transmittance operable to change from a first transmittance to a second transmittance according to voltage applied thereto;
   a lower electrode formed below the electrochromic film; and
   an upper electrode formed above the electrochromic film.

2. The solid-state imaging device according to claim 1, wherein the time necessary for changing the light transmittance of the electrochromic film from the first transmittance to the second transmittance according to the voltage applied to the electrochromic film is shorter than one second.

3. The solid-state imaging device according to claim 1, wherein the pixels include a red pixel, a green pixel and a blue pixel,
   the device further comprising a color filter (i) formed on the semiconductor substrate on a light incident path corresponding to the photoelectric converting section, (ii) in a region where each of the red pixel, the green pixel and the blue pixel is formed, and (iii) operable to transmit red, green and blue light.

4. The solid-state imaging device according to claim 1, wherein the electrochromic film is a stacked body including an electrochromic material layer, a solid electrolyte layer and an ion storage layer.

5. The solid-state imaging device according to claim 1, further comprising:
   a planarizing film formed in another portion of the pixels other than the portion of the pixels in which the electrochromic film is formed.

6. The solid-state imaging device according to claim 1, further comprising a photochromic film which is formed between the lower electrode and the upper electrode to be stacked with the electrochromic film and has light transmittance changing from a third transmittance to a fourth transmittance according to the amount of incident light.

7. The solid-state imaging device according to claim 1, wherein the upper electrode and the lower electrode are made of nano-carbon material including graphene or carbon nanotubes, or ITO.

* * * * *